US011251186B2

(12) United States Patent
Sharma et al.

(10) Patent No.: US 11,251,186 B2
(45) Date of Patent: Feb. 15, 2022

(54) COMPUTE NEAR MEMORY WITH BACKEND MEMORY

(71) Applicant: Intel Corporation, Santa Clara, CA (US)

(72) Inventors: Abhishek Sharma, Hillsboro, OR (US); Noriyuki Sato, Hillsboro, OR (US); Sarah Atanasov, Beaverton, OR (US); Huseyin Ekin Sumbul, Portland, OR (US); Gregory K. Chen, Portland, OR (US); Phil Knag, Hillsboro, OR (US); Ram Krishnamurthy, Portland, OR (US); Hui Jae Yoo, Hillsboro, OR (US); Van H. Le, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/827,542

(22) Filed: Mar. 23, 2020

(65) Prior Publication Data

US 2020/0279850 A1     Sep. 3, 2020

(51) Int. Cl.
*G11C 11/24*     (2006.01)
*H01L 27/108*     (2006.01)
(Continued)

(52) U.S. Cl.
CPC ........ *H01L 27/108* (2013.01); *G11C 11/4096* (2013.01); *H01L 27/124* (2013.01);
(Continued)

(58) Field of Classification Search
CPC . H01L 27/108; H01L 27/1207; H01L 27/124; H01L 27/1225; H01L 27/1255; H01L 27/1226; G11C 11/4096
(Continued)

(56) References Cited

U.S. PATENT DOCUMENTS

| 4,958,318 A | * | 9/1990 | Harari | ...................... G11C 8/16 |
| | | | | 257/306 |
| 6,246,083 B1 | * | 6/2001 | Noble | ................... H01L 27/108 |
| | | | | 257/296 |

(Continued)

FOREIGN PATENT DOCUMENTS

KR     20170036163 A     4/2017

OTHER PUBLICATIONS

Eehaerd, "Embedded Systems Course—module 15: SRAM memory interface to microcontroller in embedded systems", VLSI Design Services, HomeDesign Guide, Date: Dec. 30, 2016, downloaded from http://www.eeherald.com/section/design-guide/esmod15.html, 30 pages.

(Continued)

*Primary Examiner* — Viet Q Nguyen
(74) *Attorney, Agent, or Firm* — Compass IP Law PC

(57) ABSTRACT

Examples herein relate to a memory device comprising an eDRAM memory cell, the eDRAM memory cell can include a write circuit formed at least partially over a storage cell and a read circuit formed at least partially under the storage cell; a compute near memory device bonded to the memory device; a processor; and an interface from the memory device to the processor. In some examples, circuitry is included to provide an output of the memory device to emulate output read rate of an SRAM memory device comprises one or more of: a controller, a multiplexer, or a register. Bonding of a surface of the memory device can be made to a compute near memory device or other circuitry. In some examples, a layer with read circuitry can be bonded to a layer with storage cells. Any layers can be bonded together using techniques described herein.

19 Claims, 35 Drawing Sheets

(51) Int. Cl.
  *H01L 27/12* (2006.01)
  *G11C 11/4096* (2006.01)
(52) U.S. Cl.
  CPC ...... *H01L 27/1207* (2013.01); *H01L 27/1225* (2013.01); *H01L 27/1255* (2013.01); *H01L 27/1266* (2013.01)
(58) Field of Classification Search
  USPC ........................................................ 365/149
  See application file for complete search history.

(56) References Cited

U.S. PATENT DOCUMENTS

| | | | |
|---|---|---|---|
| 7,149,109 B2 | 12/2006 | Forbes | |
| 8,274,106 B2* | 9/2012 | Abbott | H01L 21/28132 |
| | | | 257/302 |
| 9,543,507 B2* | 1/2017 | Kuo | G11C 8/10 |
| 9,691,839 B2* | 6/2017 | Lindert | H01L 28/75 |
| 10,565,138 B2* | 2/2020 | Kavalieros | G06F 13/1694 |
| 2003/0160242 A1 | 8/2003 | Gonzalez et al. | |
| 2014/0346649 A1 | 11/2014 | Leedy | |
| 2019/0043553 A1 | 2/2019 | Chang et al. | |
| 2019/0057050 A1 | 2/2019 | Mathuriya et al. | |
| 2019/0057727 A1 | 2/2019 | Mathuriya et al. | |
| 2019/0080731 A1 | 3/2019 | Kavalieros et al. | |
| 2019/0138893 A1* | 5/2019 | Sharma | G06N 3/0635 |
| 2019/0198675 A1 | 6/2019 | Sharma et al. | |
| 2019/0205273 A1* | 7/2019 | Kavalieros | H01L 23/5226 |
| 2019/0304894 A1 | 10/2019 | Dorgan et al. | |
| 2019/0393223 A1 | 12/2019 | Sharma et al. | |
| 2020/0006572 A1 | 1/2020 | Sharma et al. | |
| 2020/0035683 A1* | 1/2020 | Sharma | H01L 27/10805 |
| 2020/0091156 A1* | 3/2020 | Sharma | H01L 29/78693 |
| 2020/0212041 A1* | 7/2020 | Machkaoutsan | |
| | | | H01L 27/10805 |
| 2020/0350014 A1* | 11/2020 | Liu | G11C 11/401 |
| 2020/0388319 A1* | 12/2020 | Ishizu | G11C 11/4096 |

OTHER PUBLICATIONS

Ganjala, Naveen Kumar, et. al., "A New 3T Gain Cell EDRAM for Low Power Application", International Journal of VLSI System Design and Communication Systems, vol. 05, Issue.12, Dec. 2017, 5 pages.
Giterman, Robert, "Gain Cell Embedded DRAM for Ultra-Low Power Applications at scaled CMOS Nodes", ChipEx2015, May 6, 2015, 12 pages.
Giterman, Robert, et. al., "Single-Supply 3T Gain-Cell for Low-Voltage Low-Power Applications", IEEE Transactions on Very Large Scale Integration (VLSI) Systems, vol. 24, No. 1, Jan. 2016, 5 pages.
H. sugimura, et al., "Overview and Future Challenges eDRAM Technologies", Extended Abstracts of the 2006 International Conference on Solid State Devices and Materials, Yokohama, 2006, 2 pages.
International Search Report and Written Opinion for PCT Patent Application No. PCT/US20/66985, dated May 6, 2021, 14 pages.

* cited by examiner

COMPUTE NEAR MEMORY WITH BACKEND MEMORY

BACKGROUND

State-of-the-art data-intensive applications such as artificial intelligence (AI) workloads, Machine Learning, Deep Learning, Graph Processing, and so forth process large amounts of data. For instance, Deep Learning (DL) workloads can involve performing matrix operations on large amounts of Neural Network (NN) parameters for both training and inference tasks. These data-intensive applications require large storage capacities for holding enormous amounts of data, and immense compute capabilities to process data quickly and efficiently. Addressing both storage and compute-efficiency aspects for data-intensive workloads is a challenge.

DETAILED DESCRIPTION

Figure 1:
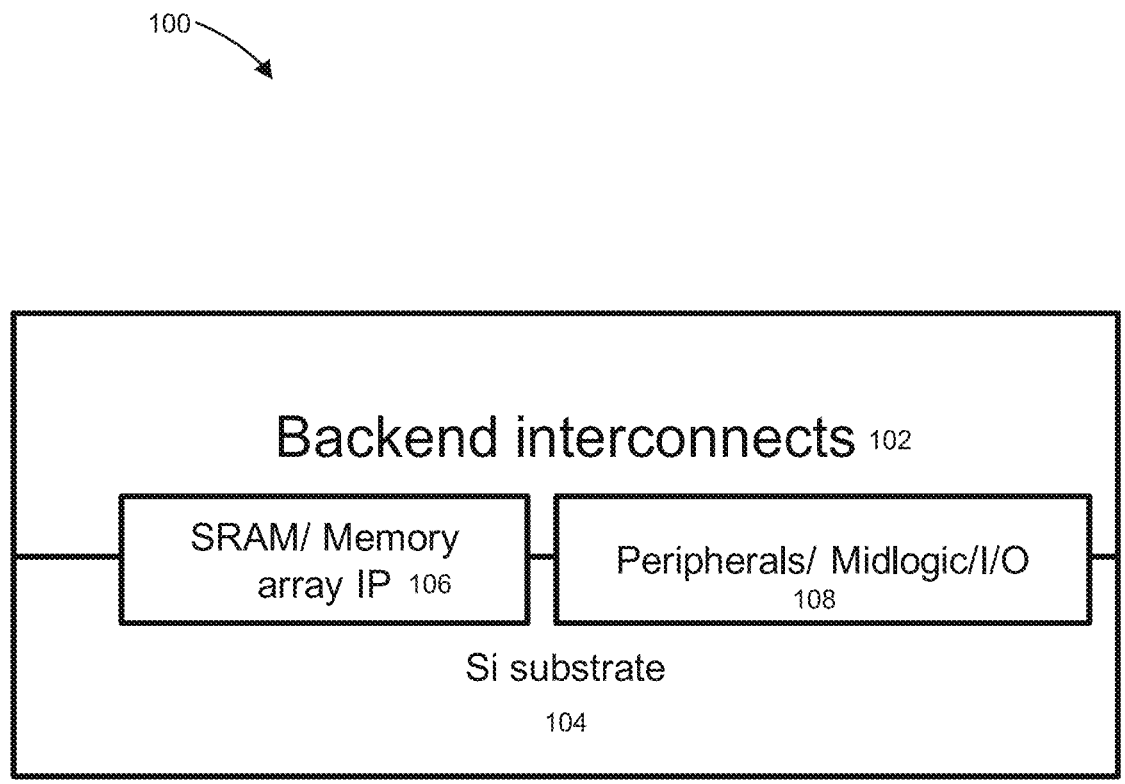
FIG. 1 depicts an example of a memory device.

Computer systems include random access memory (RAM) integrated in a same die or multi-chip module (MCM) to provide for rapid access to data. Dynamic random access memory (DRAM) is commonly used as random access memory in a computer system. However, if a DRAM uses a capacitor to store data, use of DRAM can require refreshing of stored data and corresponding circuitry and timing devices. DRAM-based memory can experience read and write latency because of time taken to charge a bit line. For example, a capacitor over bitline (COB) is a capacitor that supplies charge to a bit line. In some cases, for a read operation, given resistance capacitance (RC) time constant delays from use of a capacitor, a time to charge a bit line can be longer than desired.

Static random access memory (SRAM) is an alternative to DRAM. SRAM does not use a capacitor to store data and does not require refreshing. SRAM can provide faster read and write times than those of DRAM. SRAM is generally used for high-speed registers or caches.

In compute-near memory applications, embedded DRAM (eDRAM) memory can be utilized to enable high-density compute-near-memory (CNM) circuits. For backend eDRAM devices implemented at the backend metal layers, CNM provide compute circuits opportunistically placed under the backend eDRAM arrays on the active silicon. This way, CNM circuits localize computation right under the eDRAM arrays to minimize wasted energy and latency on data movement, and to maximize available on-die memory bandwidth for meaningful computation. eDRAM based CNM circuits provide higher memory density (e.g., more data stored for a unit area) compared to SRAM-based CNM implementations. For example, eDRAM-based CNM circuits provide high storage capacity and acceptable compute efficiency for data-intensive workloads such as artificial intelligence (AI) tasks, Machine Learning, Deep Learning, Graph Processing, decryption, encryption, decompression or compression.

Gain cell embedded DRAM (eDRAM) arrays can provide faster read and write times than DRAM or eDRAM with 1 transistor-1 capacitor (1T1C) cells. Gain cell eDRAM are considered an alternative to SRAM in some cases. Some gain cell eDRAMs use a bit cell that uses several transistors (e.g., 5 or fewer) and a dynamic storage node. For example, a 2 transistor (2T) gain cell topology includes a write transistor (MW) and a combined storage and read transistor (MR). In some cases, gain cell eDRAM technology can provide for lower row address to column address delay (tRCD) and faster read time using a read transistor (MR). For a description of gain cell eDRAM, see, for example, P. Meinerzhagen et al., "Gain-Cell Embedded DRAMs for Low-Power VLSI Systems-on-Chip" (2018).

One measure of read times is a ratio of tRCD/tRC. tRC and tRCD refer to timings associated with two subsequent row accesses in a DRAM. tRC can represent Row Cycle Time and a minimum time interval between successive active commands to a same bank. tRCD can represent Row Address to Column Address Delay and can be a number of clock cycles taken between the issuing of the active command and the read/write command. In some cases, gain cell eDRAM provides substantially lower tRCD than that of eDRAM 1T1C technology.

FIG. 1 depicts an example high level block diagram of a memory device. Memory device 100 can include an SRAM memory array intellectual property (IP) 106 and peripherals with midlogic and input/output connections 108. The memory array 106 and peripherals with midlogic and input/output (I/O) connections 108 can be formed over a silicon (Si) substrate 104. Backend interconnects 102 can be formed over memory array 106 and peripherals with midlogic and input/output (I/O) 108. By contrast, compared to use of SRAM in memory device 100, use of DRAM technology can offer significantly higher density (e.g., more data stored per area). But DRAM can be substantially slower than SRAM for read-intensive applications because every read has a writeback operation. As such, a slow and long read time can make DRAM an unattractive substitute for SRAM. To make DRAM competitive with fast memory such as SRAM, speeding-up time to charge a Capacitor Over Bitline (COB) of a DRAM memory cell can reduce read times.

Figure 2:
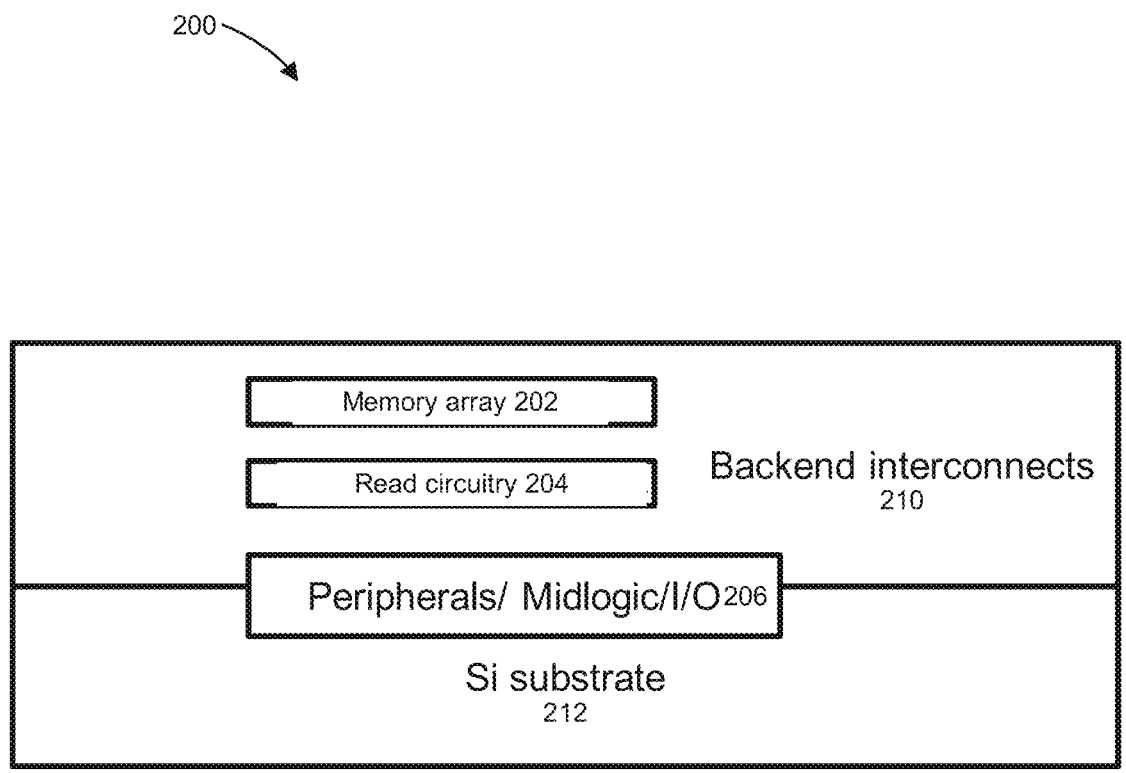
FIG. 2 depicts an example of an embodiment.

FIG. 2 depicts a high level overview example of an embodiment. Memory device 200 can include gain cell eDRAM memory array technology of stacked memory among backend interconnects. Memory array 202 can include an array of write transistors (MW) and capacitor storage. Read circuitry 204 can include one or more transistors used to read content of the capacitor storage. In order to mitigate the issues associated with slow read operations involving a capacitor storage, a gain cell eDRAM configuration can be used with fast silicon. To further improve speed of read operations involving memory array 202, layer transferred silicon can be used to provide faster read transistor technology while freeing up silicon substrate 212 underneath memory array 202 for other uses. Peripherals/mid-logic/I/O 206 can include bitline signal routing to a sense amplifier (SA), wordline drivers, silicon transistors used in connection with memory array 202 and read circuitry 204 for read, write circuitry, multiplex circuitry, decode circuitry, and so forth.

According to some embodiments, materials can be bonded using an interface layer that contacts each other. Metal-metal bonding can be formed to provide direct contact of oppositely etched metals. For example, regions can be bonded together where the regions perform different functions (e.g., write circuitry, storage, read circuitry, I/O circuitry, sense amplifiers, and so forth), are formed using different materials, or are formed at different temperatures. As is described in more detail later, two or more layers of devices can be bonded together.

In some implementations of a gain cell for a DRAM memory device, multiple transistors are used and the transistors are arranged in the same plane (e.g., X-Y plane). Arranging transistors in the same plane can use die space and reduce the amount of die space available for other uses. Various embodiments provide a write device formed on a top layer above a read device (e.g., along a Z-direction) using a bonding process and sequential three dimensional channel processing. Accordingly, DRAM-level data storage density can be provided with SRAM-level read speeds while conserving X-Y plane area for other circuits than write or read circuitry.

Figure 3A:
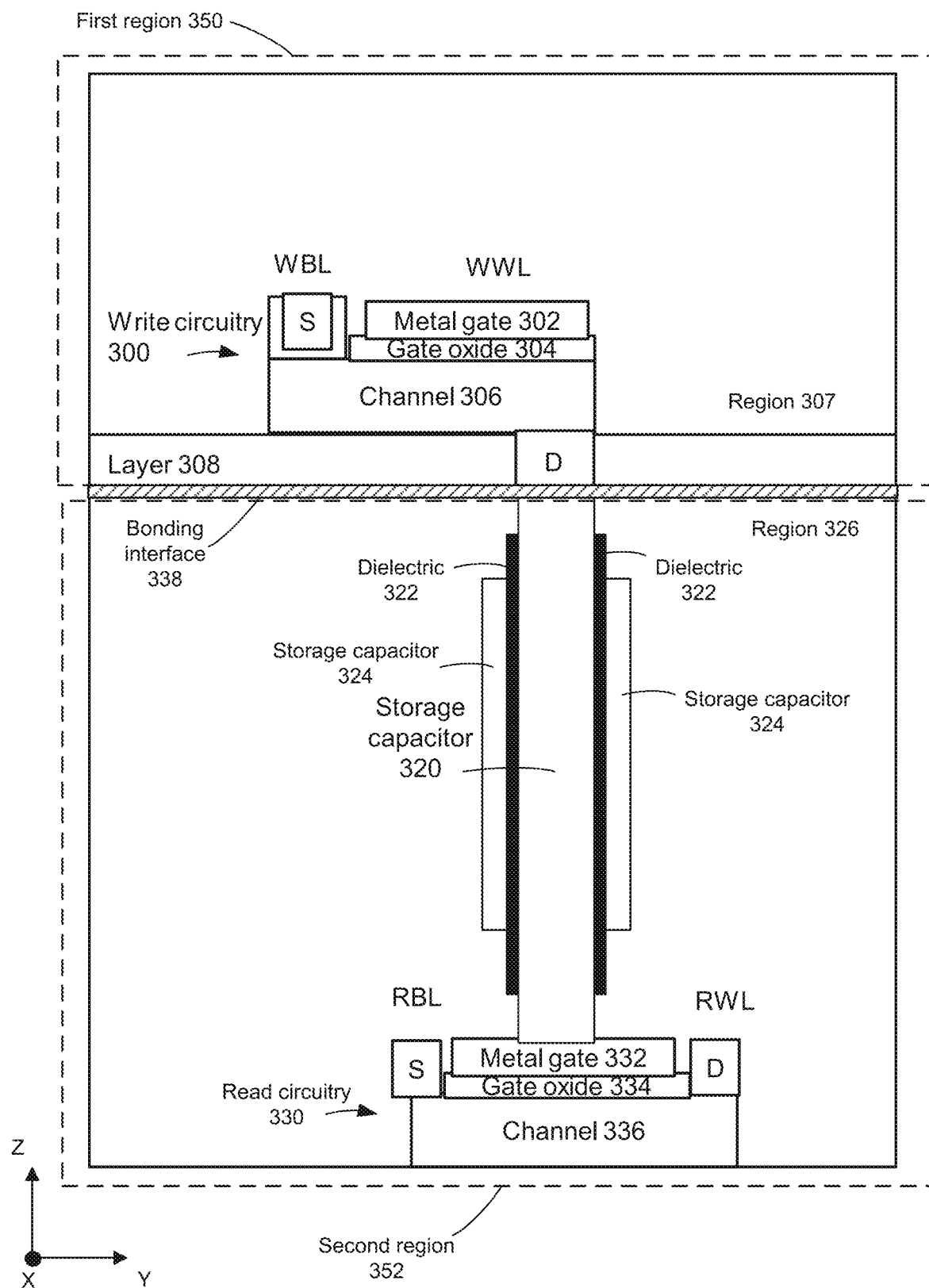
FIGS. 3A-3D depict cross sections of gain cell eDRAM structures.

FIG. 3A depicts a cross section of a gain cell eDRAM structure in accordance with some embodiments. Various embodiments provide a memory device that includes a write circuitry 300, a storage capacitor 320, dielectric 322, storage capacitor 324, and read circuitry 330. Along the Z-direction, write circuitry 300 can be positioned at least partially over top of read circuitry 330 and in a different plane than that of read circuitry 330. Write circuitry 300 can be conductively coupled to storage capacitor 320 and read circuitry 330 can be conductively coupled to storage capacitor 320. In some embodiments, layer 308 (in contact with write circuitry 300) can be bonded to storage capacitor 320 in manners described herein.

In some examples, write circuitry 300 can include metal gate 302, gate oxide 304, channel 306, and source (S) and drain (D) regions. Metal gate 302 can include one more of: titanium nitride (TiN), tungsten, copper, tantalum nitride (TaN), ruthenium (Ru), copper oxide, nickel, carbon, titanium, tantalum, poly-Si, poly-Ge, iridium, iridium oxide, hafnium nitride, etc. Gate oxide 304 can include one or more of: hafnium oxide, silicon oxide, aluminum oxide, silicon nitride, silicon carbide, h-BN, carbon, lanthanum oxide, any combination or multi-layers of these. Channel 306 can include one or more of poly-Si/Ge/III-V/GaN, single crystal layer transferred Si/Ge/III-V/GaN, IGZO (indium gallium zinc oxide), Indium Oxide, zinc oxide, WSe2, WS2, MoSe2, black phosphorus, SnO, HfSnO, Cu2O, CoO, IZO, AZO, Indium tungsten oxide, indium tin oxide (ITO) or any combination of these or doping with SiO2, HfO2, Al2O3 or other electrical insulators.

Source and drain regions can be formed within a substrate adjacent to the gate stack of each transistor. The source and drain regions can be formed using either an implantation or diffusion process or an etching or deposition process. For implantation or diffusion, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In etching or deposition process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

In some examples, metal gate 302 can completely cover gate oxide 304 or cover a portion of gate oxide 304 along the X-Y plane. In some examples, gate oxide 304 can cover a portion of channel 306 along the X-Y plane. A source region (S) can be formed to contact channel 306. A write bit line (WBL) (not depicted) can be coupled to source region (S). Drain region (D) can be formed within a channel through layer 308. Layer 308 can include one or more of: silicon Nitride (SiN) etch stop, oxide layer (e.g., SiO2, Al2O3), nitride layer, or carbide layer. Drain region (D) can be coupled to channel 306 and storage capacitor 320. Various example configurations of write circuitry 300 are described herein for example, with respect to FIG. 7A.

Write circuitry 300 and layer 308 can be formed within a region 307 using any semiconductor processing techniques including one or more of: etching, chemical vapor deposition (CVD), polishing, doping, electron implantation, ion implementation, epitaxial growth, and so forth. Region 307 can be any type of insulating or semiconducting material such as but not limited to oxide, field oxide, nitride, silicon-nitride.

According to some embodiments, bonding interface 338 can be used to bond a bottom plane of layer 308 of first region 350 to a top plane of second region 352 which includes region 326 and to conductively couple drain region (D) to storage capacitor 320. In some examples, bonding interface 338 can include one or more of: silicon dioxide (SiO2), silicon oxynitride (SiON), carbon doped-silicon oxynitride (SiOCN), silicon carbon nitride (SiCN), or silicon oxycarbide (SiOC). Application of the bonding material over a surface can be performed by Physical Vapor Deposition (PVD), Chemical Vapor Deposition (CVD), Plasma-enhanced chemical vapor deposition (PECVD), Atomic Layer Deposition (ALD), Plasma Enhanced Atomic Layer Deposition (PEALD), spin-on, wet deposition processes, or other similar process.

To bond surfaces a bottom surface of first region 350 to a top surface of second region 352, bonding interface 338 can be applied to bottom surface of first region 350 and applied to a top surface of second region 352. The bond can be activated by preparing the surfaces with a plasma treatment (e.g., exposure of high energy ions of nitrogen, argon, oxygen, NH3, Cl, F2 and the like) that creates broken or dangling bonds. These dangling bonds can improve the adhesiveness of a wafer used to form first region 350 to a wafer used to form second region 352. The wafers are aligned to each other using alignment marks and pressed against each other at a temperature ranging from, e.g., room temperature to 400° C.

Storage capacitor and dielectric (e.g., 320, 322, and 324) can include an inner electrode material (320) such as Titanium Nitride, Tantalum Nitride, W, Ru, Ir, Cu, Ta, Ti, or a combination or multilayered structure of these. Dielectric 322 can include silicon oxide, titanium oxide, zirconium oxide, hafnium oxide, hafnium zirconium oxide, aluminum oxide, STO (e.g., SrTiO$_3$) material, BTO (e.g., BaTiO$_3$) material, piezoelectric (PZT) material. Dielectric 322 can include a plate formed around inner electrode material 320 (e.g., covering surfaces of cylinder-shaped inner electrode material 320) and positioned between inner electrode material 320 and outer electrode 324.

Read circuitry 330 can be formed in the (−Z) direction underneath storage capacitor 320. In some examples, read circuitry 330 can include metal oxide 332, gate oxide 334, and channel 336. Metal gate 332 can include one or more of: titanium nitride (TiN), tungsten, copper, tantalum nitride (TaN), ruthenium (Ru), copper oxide, nickel, carbon, titanium, tantalum, poly-Si, poly-Ge, iridium, iridium oxide, hafnium nitride, etc. Gate oxide 334 can include one or more of: hafnium oxide, silicon oxide, aluminum oxide, silicon nitride, silicon carbide, h-BN, carbon, lanthanum oxide, any combination or multi-layers of these. Channel 336 can include one or more of poly-Si/Ge/III-V/GaN, single crystal layer transferred Si/Ge/III-V/GaN, IGZO (indium gallium zinc oxide), Indium Oxide, zinc oxide, WSe2, WS2, MoSe2, black phosphorus, SnO, HfSnO, Cu2O, CoO, IZO, AZO, Indium tungsten oxide, indium tin oxide (ITO) or any combination of these or doping with SiO2, HfO2, Al2O3 or other electrical insulators.

In some examples, metal gate 332 can completely cover gate oxide 334 or cover a portion of gate oxide 334 along the X-Y plane. In some examples, gate oxide 334 can cover a portion of channel 336 along the X-Y plane. A source region (S) can be formed to contact gate oxide 334 and channel 336. Source region (S) can be coupled to receive a signal from a read bit line (RBL) (not shown). A drain region (D) can be formed to contact channel 336 and to contact gate oxide 334. Drain region (D) can be coupled to receive a signal from a read word line (RWL) (not shown).

Storage capacitor 320, dielectric 322, storage capacitor 324 and read circuitry 330 can be formed within region 326 using any semiconductor processing techniques including one or more of: etching, chemical vapor deposition (CVD), polishing, doping, electron implantation, ion implementation, epitaxial growth, and so forth. Region 326 can be any type of insulating or semiconducting material such as but not limited to oxide, field oxide, nitride, silicon nitride, aluminum oxide.

In some embodiments, first region 350 can include write circuitry 300, layer 308, and region 307 formed at a first temperature or temperature range, such as, but not limited to 100° C.-2000° C. Second region 352 can include storage capacitor 320, dielectric 322, storage capacitor 324, read circuitry 330, and region 326 formed at a second temperature or temperature range, such as, but not limited to 100° C.-2000° C. The second temperature or temperature range can be different and or at least partially overlapping with that of the first temperature or temperature range. Accordingly, first region 350 and second region 352 can be created at different temperatures and bonded together using bonding interface 338.

Figure 3B:
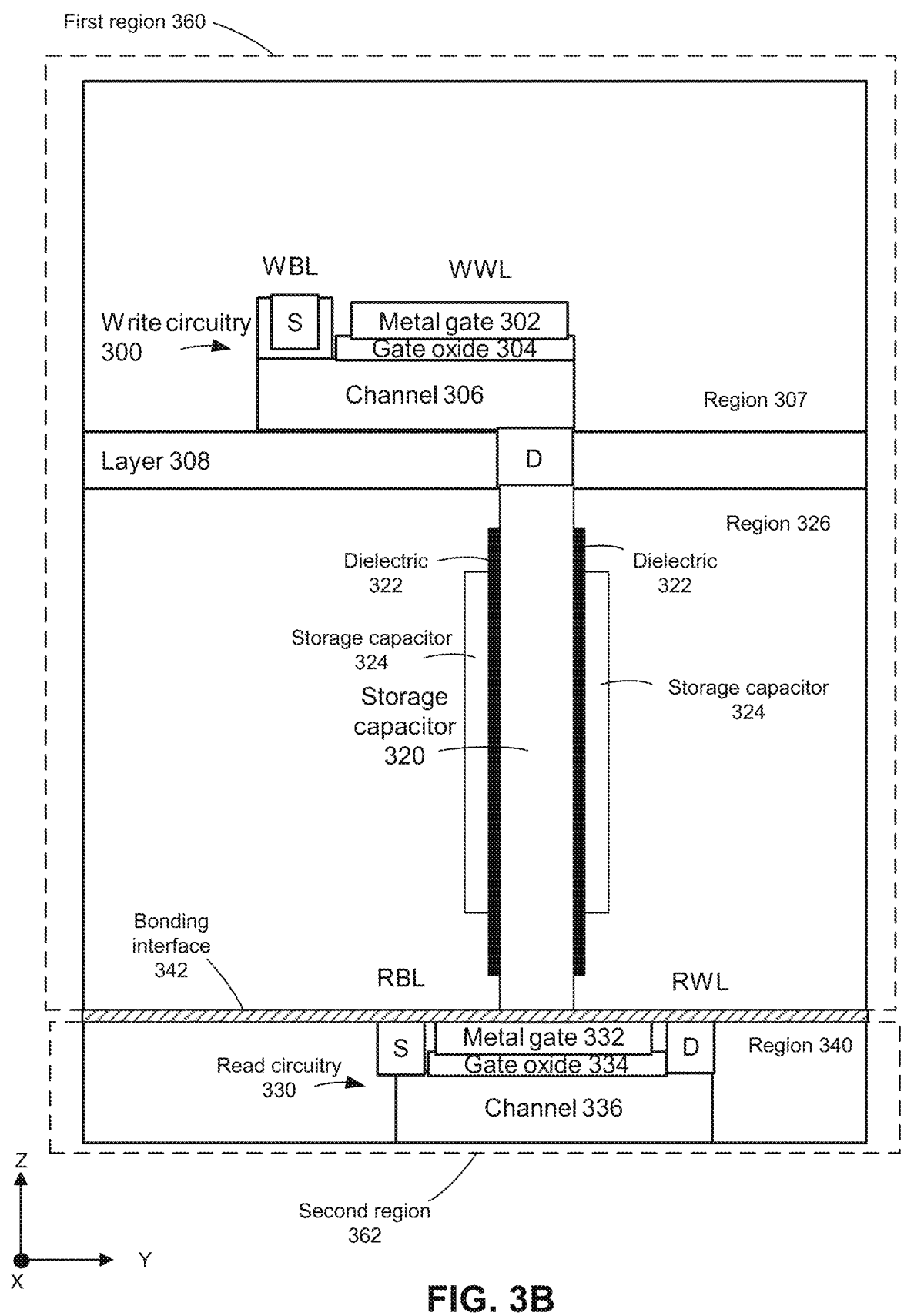

FIG. 3B depicts an example cross section of a gain cell eDRAM structure in accordance with some embodiments. In some embodiments, first region 360 can include write circuitry 300, layer 308, and region 307 formed together with storage capacitor 320, dielectric 322, storage capacitor 324, read circuitry 330, and region 326 at a first temperature or temperature range. In this example, rather than bonding of layer 308 and a drain (D) region to region 326 and a portion of storage capacitor 320, as in the example of FIG. 3A, layer 308 and drain region are formed over region 326 and storage capacitor 320.

Second region 362 can include read circuitry 330 formed within region 340 at a second temperature or temperature range. The second temperature or temperature range can be different and or at least partially overlapping with that of the first temperature or temperature range. Read circuitry 330 can be formed within region 340 using any semiconductor processing techniques including one or more of: etching, chemical vapor deposition (CVD), polishing, doping, electron implantation, ion implementation, epitaxial growth, and so forth. Region 340 can be any type of insulating or semiconducting material such as but not limited to oxide, field oxide, nitride, silicon nitride, aluminum oxide.

In some embodiments, first region 360 and second region 362 can be created at different or overlapping temperatures and bonded together using bonding interface 342. In this example, using bonding interface 342, read circuitry 330 can be bonded to region 326 and metal gate 332 can be conductively coupled to storage 320. In this example, to form bonding interface 342, a lower portion of first region 360 can be covered with material of bonding interface 342 and an opposing portion of second region 362 can be covered with material of bonding interface 342. Bonding interface 342 can include one or more of: silicon dioxide (SiO2), silicon oxynitride (SiON), carbon doped-silicon oxynitride (SiOCN), silicon carbon nitride (SiCN), or silicon oxycarbide (SiOC). To bond first region 360 to second region 362, techniques described earlier with respect to bonding interface 338 can be used.

Note that in some cases, forming storage capacitor and dielectric (e.g., 320, 322, and 324) occurs at higher or different temperatures than those used to manufacture write circuitry 300 or read circuitry 330 such manufacturing storage capacitor and dielectric (e.g., 320, 322, and 324) is incompatible with manufacturing write circuitry 300 or read circuitry 330. Bonding provides a manner of combining write circuitry 300 or read circuitry 330 with storage capacitor and dielectric (e.g., 320, 322, and 324).

Figure 3C:
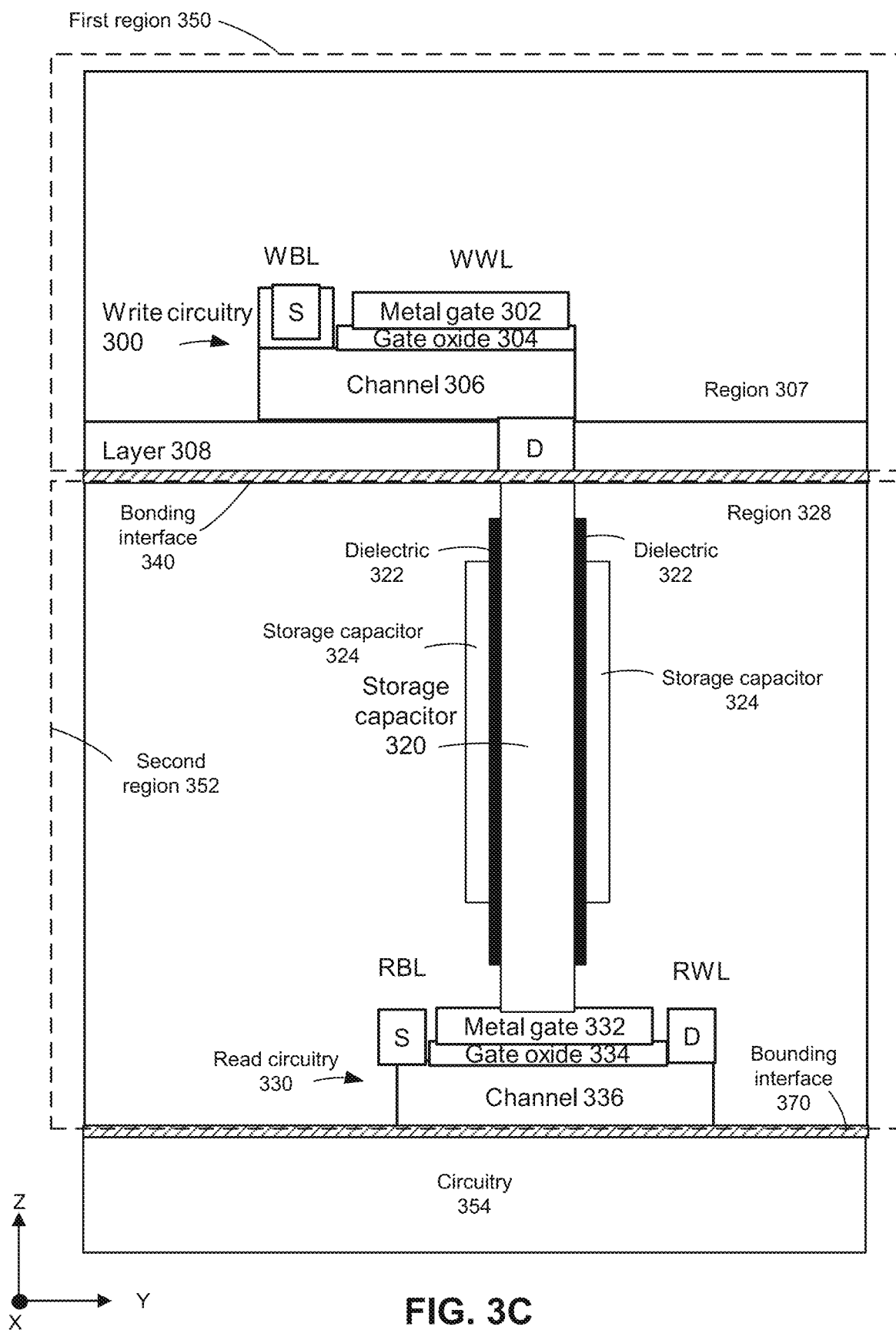

FIG. 3C depicts an example cross section of a gain cell eDRAM structure in accordance with some embodiments. In this example, first region 350 is bonded to second region 352 using bonding interface 338. Second region 352 is bonded to circuitry 354 using bonding interface 370. In this example, to form bonding interface 370, a lower portion of second region 352 can be covered with material of bonding interface 370 and an opposing portion of circuitry 354 can be covered with material of bonding interface 370. Bonding interface 370 can include one or more of: silicon dioxide (SiO2), silicon oxynitride (SiON), carbon doped-silicon oxynitride (SiOCN), silicon carbon nitride (SiCN), or silicon oxycarbide (SiOC). To bond first region 350 to second region 352, techniques described earlier with respect to bonding interface 370 can be used. Circuitry 354 can include Vcc, Vss terminals for sensing circuitry, compute near memory (CNM) circuitry, SRAM emulation circuitry (described herein), vias, bit line or word line drivers, among other circuitry.

Figure 3D:
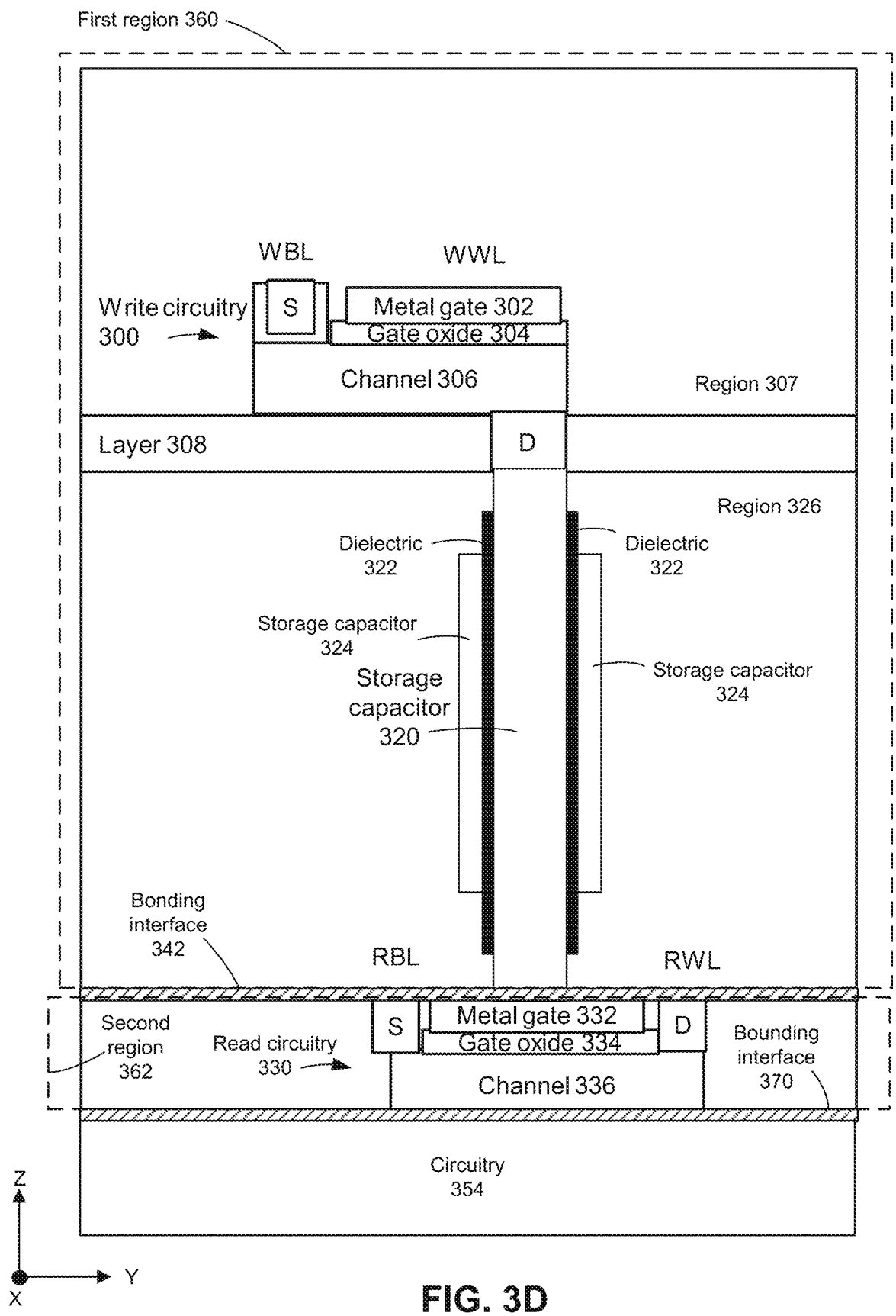

FIG. 3D depicts an example cross section of a gain cell eDRAM structure in accordance with some embodiments. In this example, first region 360 can be bonded to second region 362 using bonding interface 342. Second region 362 can also be bonded to circuitry 354 using bonding interface 370 in a similar manner as described earlier. Accordingly, a bonding interface can be used to join any structures and provide conductive coupling.

Figure 4:
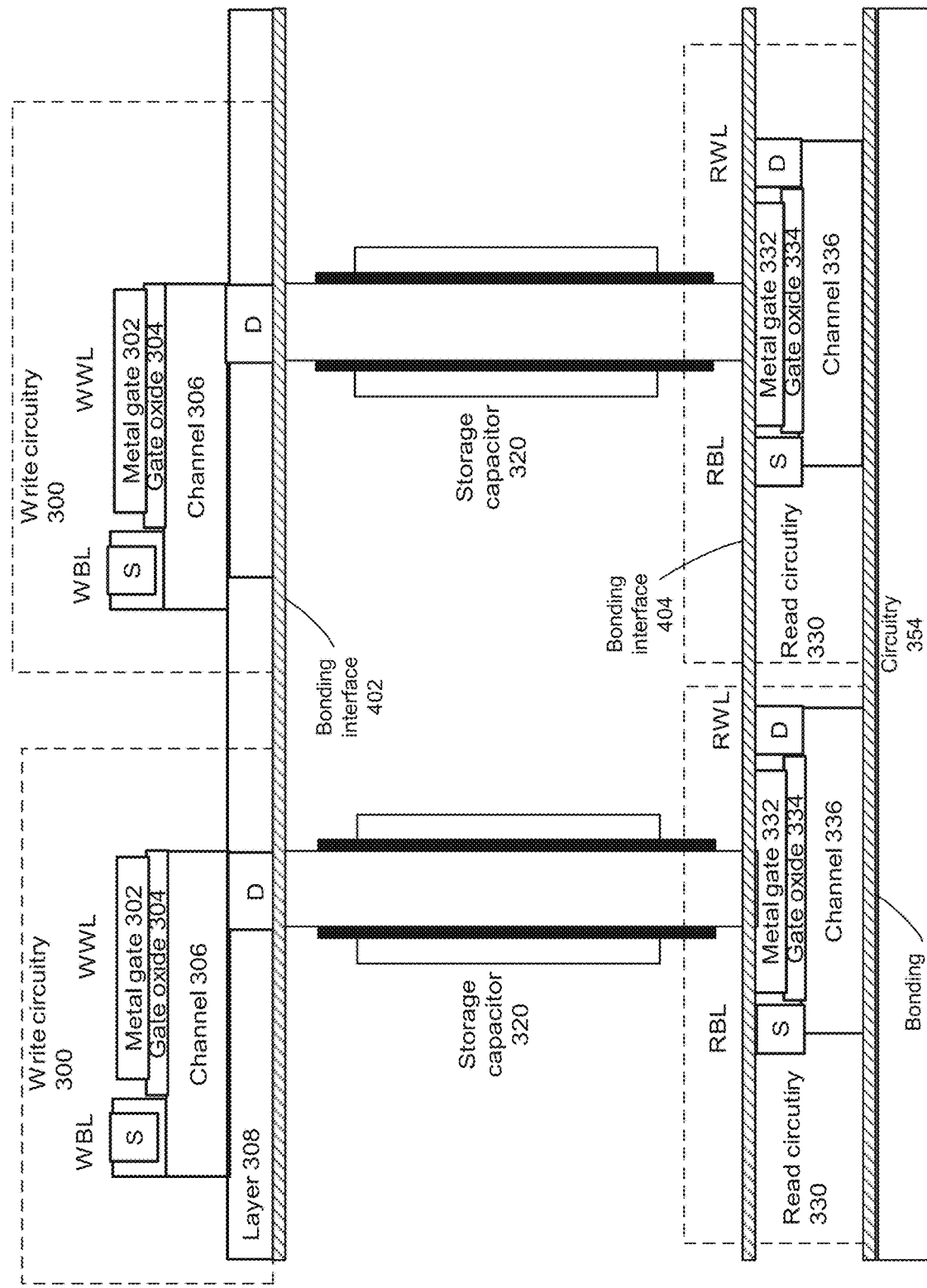
FIG. 4 depicts an example of side-by-side gain cell devices with shared layer.

FIG. 4 depicts an example of side-by-side gain cell devices with a shared layer. The shared layer can be layer 308. As described earlier, bonding between different structures can be performed. For example, one or more of bonding interfaces 402, 404, and/or 406 can be used to bond different structures together while permitting conductive coupling where needed. Bonding interfaces 402, 404, and/or 406 can include one or more of: silicon dioxide (SiO2), silicon oxynitride (SiON), carbon doped-silicon oxynitride (SiOCN), silicon carbon nitride (SiCN), or silicon oxycarbide (SiOC). Techniques described earlier with respect to bonding interface 338 can be used to bond different regions together.

Figure 5:
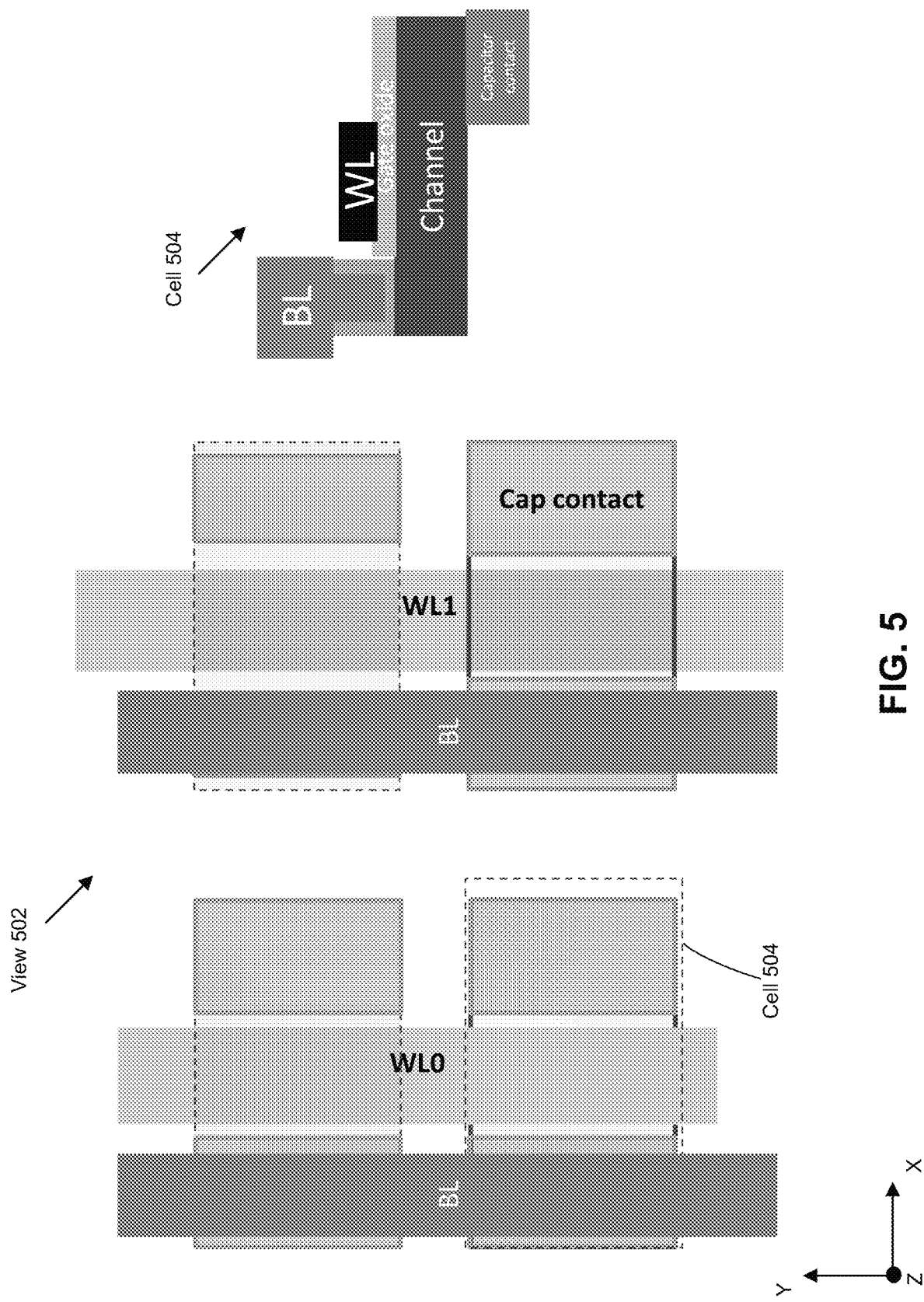
FIG. 5 depicts an example of a top-down view of the structure of FIG. 4.

FIG. 5 depicts an example of a top-down view of the structure of FIG. 4. View 502 provides a top-down view of a write circuitry in accordance with some embodiments. Cell 504 can include a write circuitry in accordance with some embodiments. In some examples, a top down view 502 of cell 504 shows bit line (BL) formed over the cell 504 and the bit line (BL) is contact at least one other copy of cell 504. In addition, word line WL0 can be coupled to gate oxide of cell 504 and contact at least one other copy of cell 504. A capacitive contact (Cap contact) can be positioned below cell 504 for connection with capacitive storage (not shown).

Figure 6:
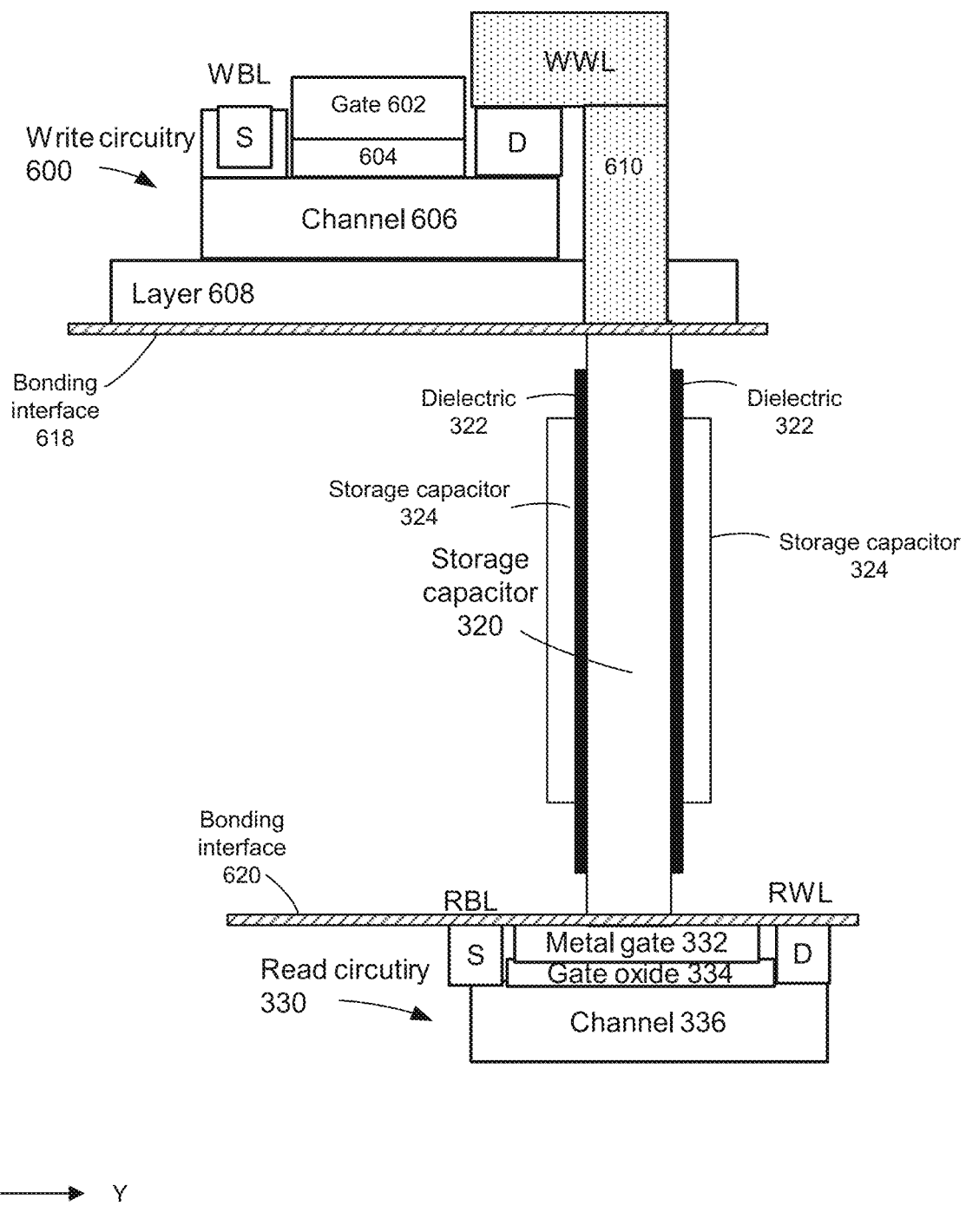
FIG. 6 depicts a cross section of a gain cell eDRAM structure in accordance with some embodiments.

FIG. 6 depicts a cross section of a gain cell eDRAM structure in accordance with some embodiments. Various embodiments provide a memory device that includes a write circuitry 600, a storage capacitor 320, dielectric 322, storage capacitor 324, and read circuitry 330. Write circuitry 600 can be positioned at least partially over top of read circuitry 330 in the Z direction and in a different X-Y plane than that of read circuitry 330. Write circuitry 600 can be conductively coupled to storage capacitor 320 and read circuitry 330 can be conductively coupled to storage capacitor 320.

Write circuitry 600 can include metal gate 602, gate oxide 604, channel 606, and layer 608. Metal gate 602 can include one or more of: titanium nitride (TiN), tungsten, copper, tantalum nitride (TaN), ruthenium (Ru), copper oxide, nickel, carbon, titanium, tantalum, poly-Si, poly-Ge, iridium, iridium oxide, hafnium nitride, etc. Gate oxide 604 can include one or more of: hafnium oxide, silicon oxide, aluminum oxide, silicon nitride, silicon carbide, h-BN, carbon, lanthanum oxide, any combination or multi-layers of these. Channel 606 can include one or more of poly-Si/Ge/III-V/GaN, single crystal layer transferred Si/Ge/III-V/GaN, IGZO (indium gallium zinc oxide), Indium Oxide, zinc oxide, WSe2, WS2, MoSe2, black phosphorus, SnO, HfSnO, Cu2O, CoO, IZO, AZO, Indium tungsten oxide, indium tin oxide (ITO) or any combination of these or doping with SiO2, HfO2, Al2O3 or other electrical insulators. Layer 608 can be formed to include silicon Einsteinium (SiN Es).

In some examples, metal gate 602 can completely cover gate oxide 604 or cover a portion of gate oxide 604 along the X-Y plane. Gate oxide 604 can cover a portion of channel 606. A source region (S) can be formed to contact channel 606. A write bit line (WBL) signal can be coupled to source region (S) (not depicted). Drain region (D) can be formed to contact channel 606. Connection 610 can couple drain region (D) to storage capacitor 320. In some examples, connection 610 can be formed of one or more of: Cu, Ru, TiN, W, or Co. Connection 610 can be formed through a portion of layer 608. In this example, connection 610 is an inverted L shape structure, although any shape can be used.

In this example, one or more of bonding interface 618 or bonding interface 620 can be formed and used in a similar manner as that described with respect to the structures of FIGS. 3A-3D. Bonding interface 618 and/or 620 can include one or more of: silicon dioxide (SiO2), silicon oxynitride (SiON), carbon doped-silicon oxynitride (SiOCN), silicon carbon nitride (SiCN), or silicon oxycarbide (SiOC).

Figure 7A:
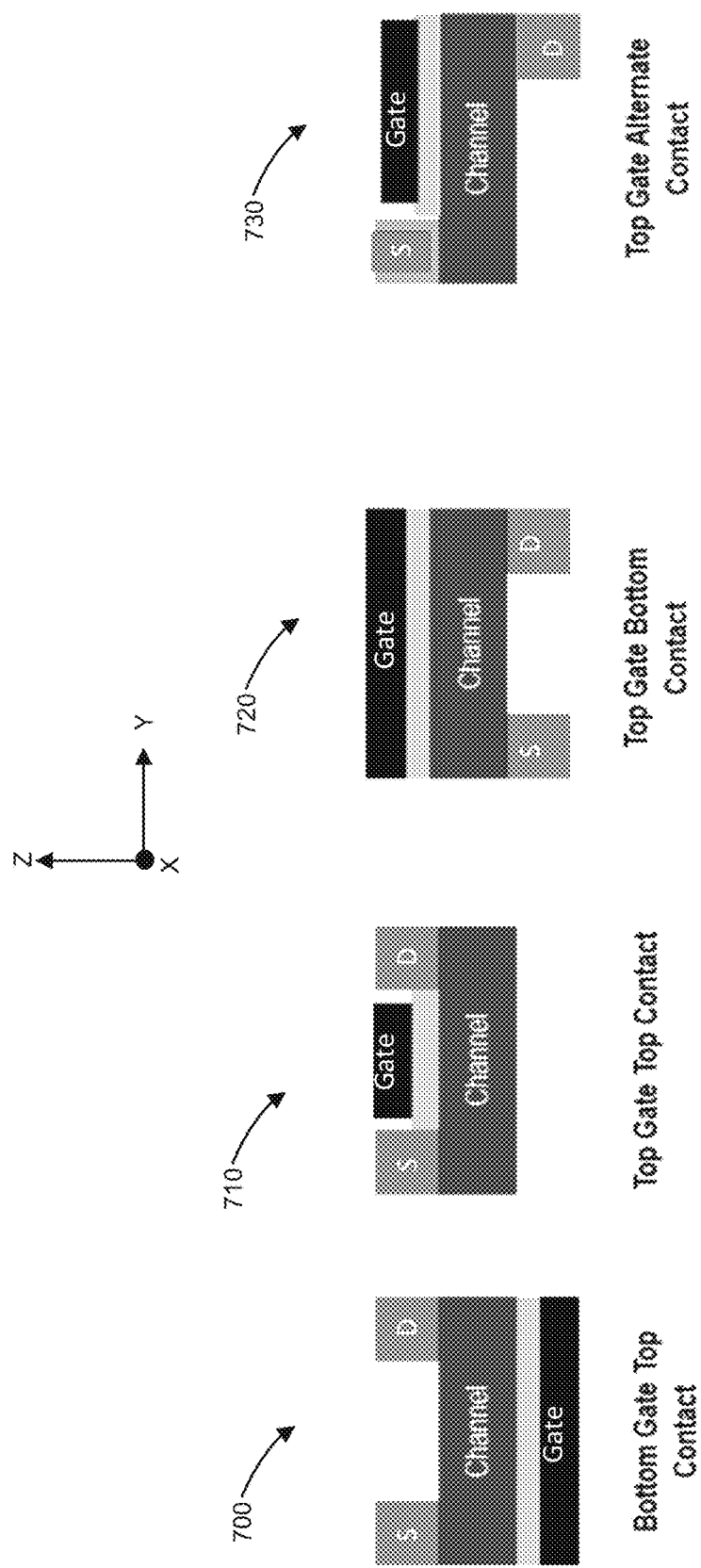
FIGS. 7A-7C depict various examples of top and bottom gate structures.

FIG. 7A depicts cross sections of various examples of top and bottom gate structures. In this example, structures 700, 710, 720, and 730 are shown and can be used in write or read circuitry. In some examples, for a top gate top contact, thin film transistor configurations can be used with no sidewall gate. In some examples, FinFET configurations can be used at least for gate structures. Materials used to form write (top) and read (bottom) transistors can include one or more of: Poly-Si, Si, Ge, poly-Ge, GaN, transition metal dichalcogenides (TMDs) (e.g., MoS2, WSe2, MoSe2, WSe2), InS, HfS, ZnS, ZnSe, In2O3, ZnO, AZO, IGZO, IZO and other backend compatible materials. Backend can include processing layers that succeed the formation of bulk silicon transistors. Backend compatible materials can include metals and dielectrics, with a temperature budget that is <approximately 500° C. Various embodiments provide backend compatible transistors described herein.

Figure 7B:
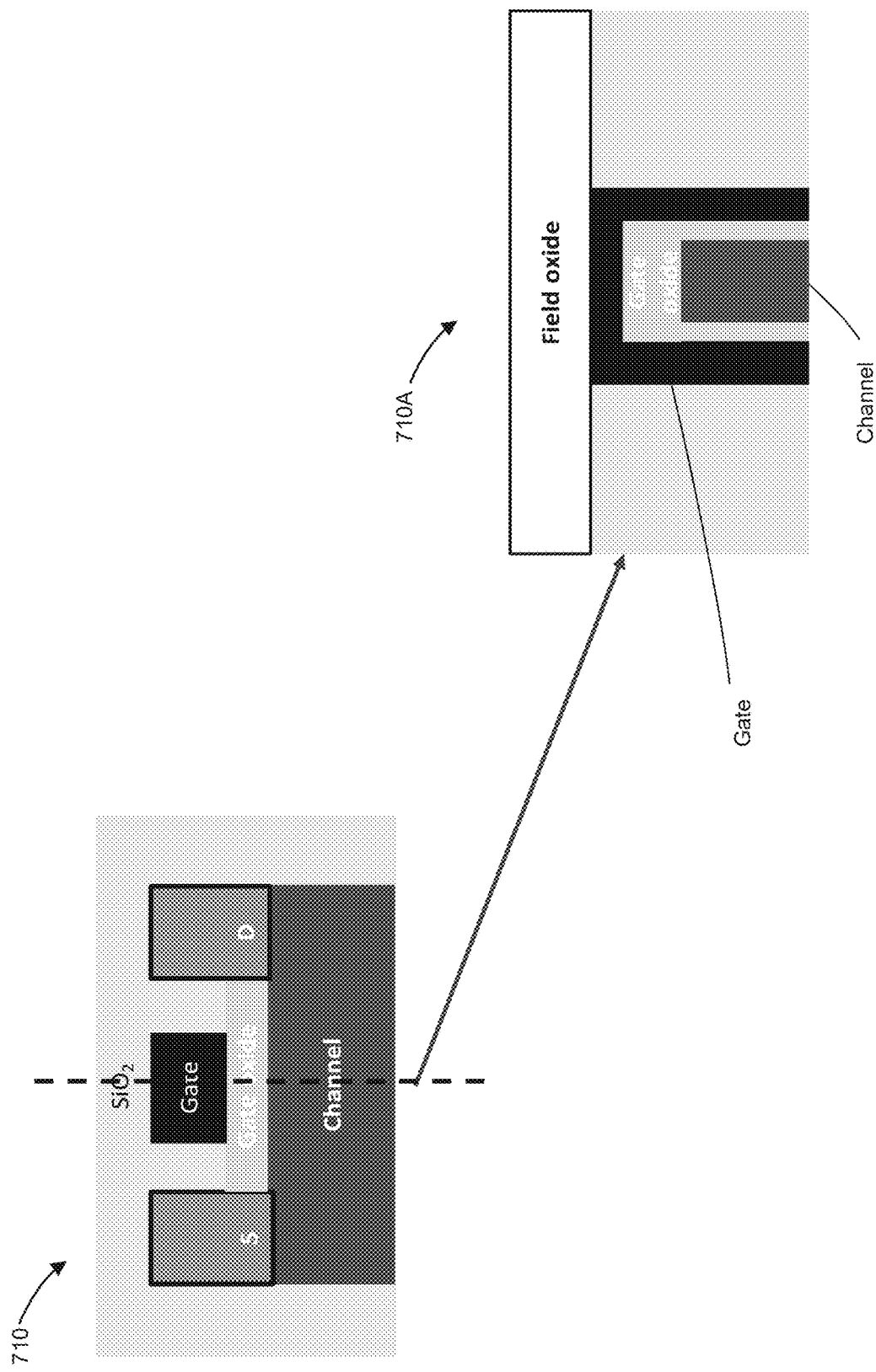

FIG. 7B depicts an example of a cross section of a top gate top contact structure of some embodiments. In this example, structure 710A is a cross sectional view of structure 710. A fin field-effect transistor (FinFET) implementation is used for the gate structure and a sidewall gate is present. According to some embodiments, a fin (e.g., narrow channel) provides improved gate control, improved subthreshold swing, and improved leakage over planar implementation. Improved gate control can improve drive current (performance) at a given voltage, while maintaining low Ioff (off-state leakage) at a negative or zero volts. The read and/or write transistors can be sharply turned off whereby a subthreshold swing (e.g., rate of decrease in current with reducing gate voltage) can be sharp or low.

Figure 7C:
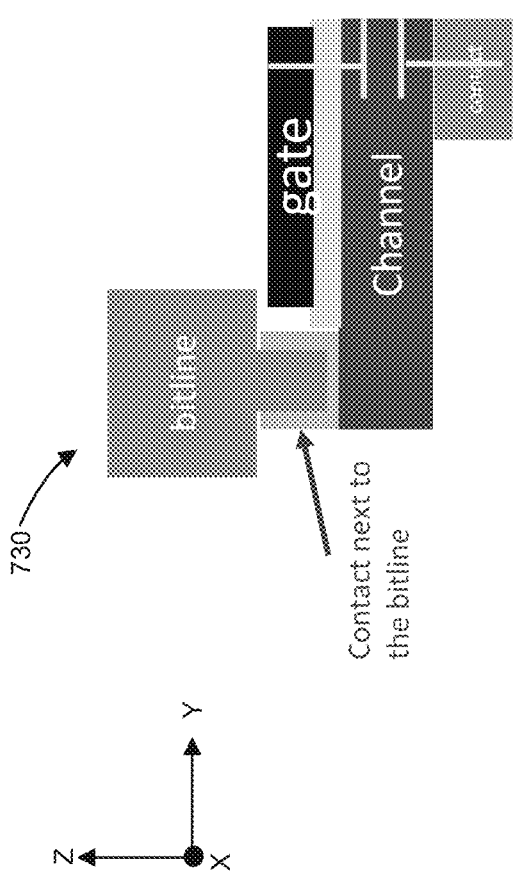

FIG. 7C depicts an example of top gate alternate contact with gate overlapping with a capacitor contact. Structure 730 includes an overlap between gate and contact in the Z direction and no overlap or contact with the contact next to the bitline. Overlap between gate and contact in the Z direction results in extra charge in a channel beneath the gate (due to gate field) which induces electrostatic doping. This electrostatic doping improves the contact resistance, which improves the drive current (performance). Improving driver current performance can decrease time to charge a storage capacitor and reduce latency (e.g., time to read/write). If the gate overlaps the contact next to the bitline contact, poor signal-to-noise ratio in discerning 0 or 1 value stored in a storage capacitor due to capacitance formed between gate and contact. But because the capacitance is formed on the capacitor contact side instead, signal-to-noise ratio may not be negatively impacted and improved data retention in capacitor storage can result.

Figure 8:
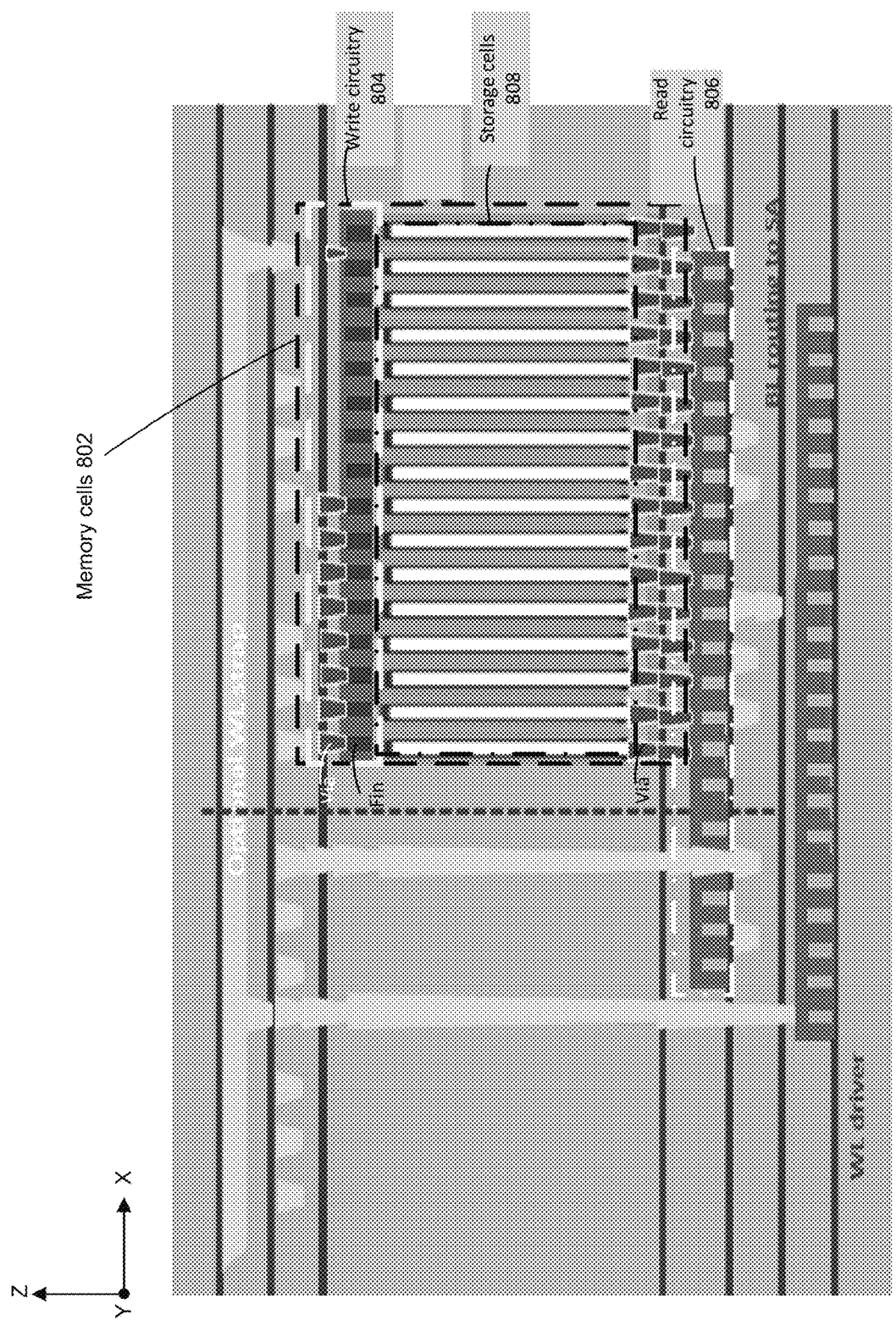
FIG. 8 depicts a cross sectional view of a memory device with multiple gain cell eDRAM devices.

FIG. 8 depicts a cross sectional view of a memory device with multiple gain cell eDRAM devices. In accordance with various embodiments, memory cells 802 includes multiple bit cells with backend write circuitry 804 (MW) positioned over top of read circuitry 806 (MR) in the Z direction as opposed to sitting in the X-Y plane with read circuitry 806. In some examples, along the Z direction, backend write circuitry 804 is connected to storage cells 808 and read circuitry 806 is connected to storage cells. In this example, write circuitry 804 is implemented as FinFET transistors with gate wrapping around channels. Write circuitry 804 can write bits into storage cells 808. In this example, storage cells 808 can be implemented as Capacitor Over Bitline (COB) devices. Read circuitry 806 can preampify one or more bits stored in storage cells 808 and an MR transistor used to sense CSN state of storage cells 808. An array of MR transistors can read stored CSN state.

As is described in more detail herein, multiple layers of devices can be bonded and stacked on top of each other. For example, one layer can include only N-type metal-oxide-semiconductor (MOS) (NMOS) transistors or only P-type MOS transistor (PMOS) transistors and another layer above or beneath can include complementary metal-oxide-semiconductor (CMOS) (with NMOS and PMOS transistors).

Figure 9:
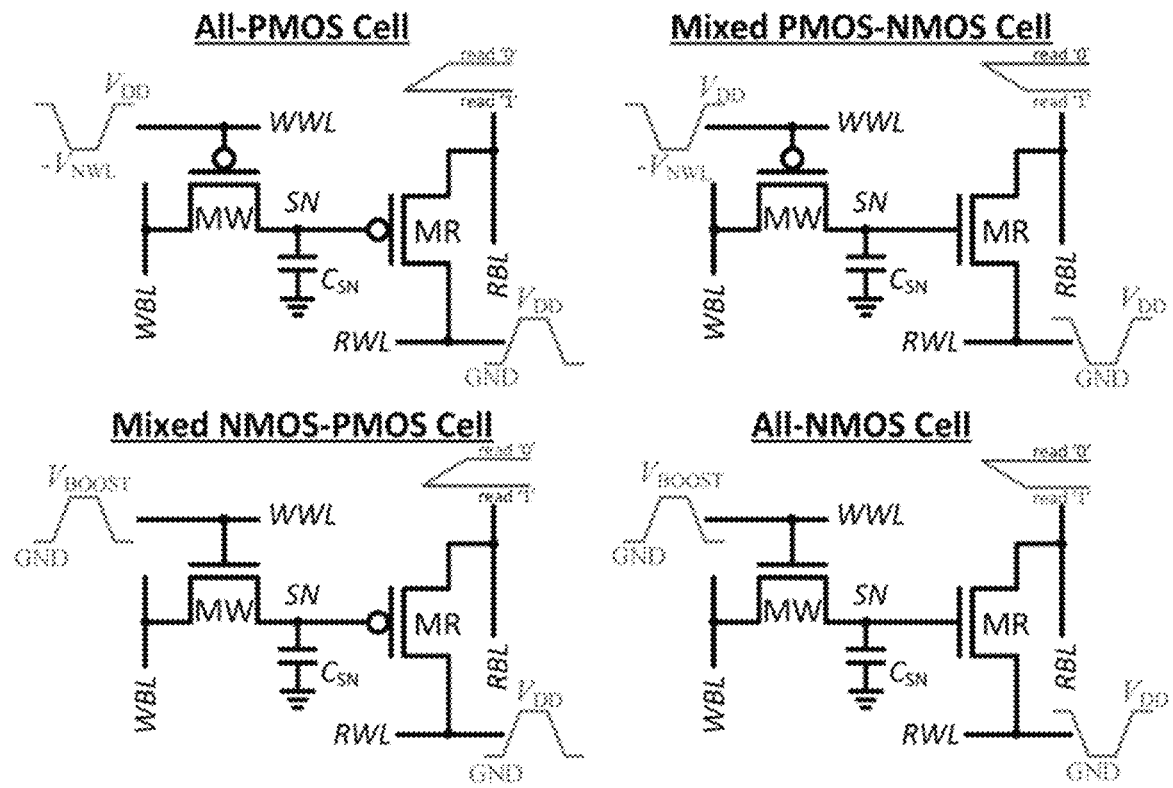
FIG. 9 shows circuit representations of some embodiments of gain cell transistors.

FIG. 9 shows circuit representations of some embodiments of gain cell transistors. Example read and write operations concerning at least devices of FIGS. 3A-3D, 4, 6, and 8 are described next. A read transistor (MR) and write transistor (MW) interact with a capacitor CSN of a memory circuit. For example, for an all-NMOS transistor read transistor (MR) and write transistor (MW) implementation, a DRAM bit cell includes MW transistor and capacitor CSN. For a write operation, switching on WBL causes transfer of charge stored in capacitor CSN to node SN, which connects to a gate of read transistor MR. To write a logical 1, a read transistor MR is activated. To write a logical 0, read transistor MR is an open circuit.

To read data from capacitor CsN, WBL is kept off and charge is discharged from capacitor CSN to line WBL but subject to an RC time constant delay. When a 1 is stored in capacitor CsN, a gate of MR has a voltage and its channel resistance is low. When a 0 is stored in capacitor CsN, resistance is high. A change of resistance between RWL and RBL occurs because a gate of MR is at certain potential (0 or 1). Applying a constant voltage difference between RWL and RBL allows reading of content of capacitor CsN. If capacitor CSN stores a 1, current through read transistor is high. If capacitor CSN stores a 0, current level through read transistor is low, if the read transistor is an NMOS device; the order reverses if the read transistor is a PMOS device.

However, connecting an SN node to a gate of a read transistor MR consumes area if MR transistor is next to a MW transistor in an X-Y plane. If write circuitry is a backend transistor then write circuitry does not consume additional X-Y plane space in addition to read circuitry, which is in the front end. Backend transistors can have contacts underneath (gate and contacts are not in same plane). As described herein, various embodiments provide MW transistors in a plane above MR transistors.

Figure 10A:
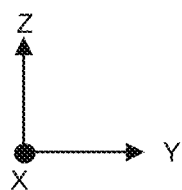
FIGS. 10A-10F depict an example of forming a memory device.
Figure 10A:
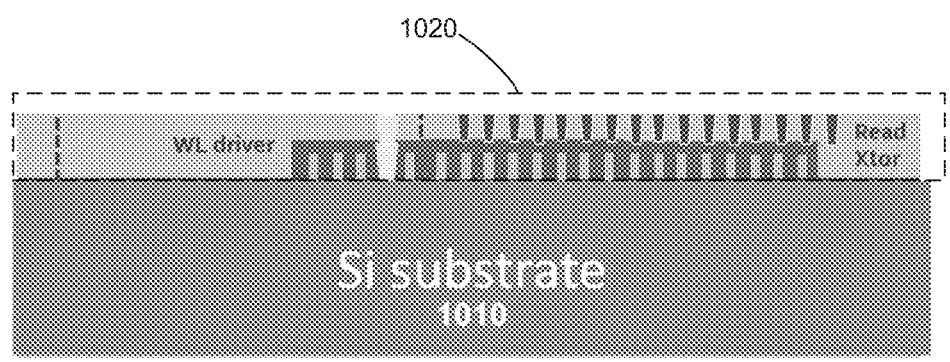

FIGS. 10A-10F depict an example of forming a memory device. For example, the memory device can be a gain cell eDRAM device. FIG. 10A shows a cross sectional view of a silicon substrate 1010. In embodiments, substrate 1010 may be a silicon substrate, a glass substrate, such as soda lime glass or borosilicate glass, a metal substrate, a plastic substrate, a substrate including SiO2, or another suitable substrate. Structure 1020 can be formed in or over silicon substrate 1010. Structure 1020 can include read (MR) transistors, vias, redistribution, metal routing, word line (WL) driver, power supplies, memory controllers, memory management units, row decoder and drivers, and logic and processing circuitry. Structure 1020 can be formed on or in silicon substrate 1010 by various material depositions, etching, polishing and so forth. Structure 1020 can include active circuitry of any type using planar or FinFET technology.

Figure 10B:
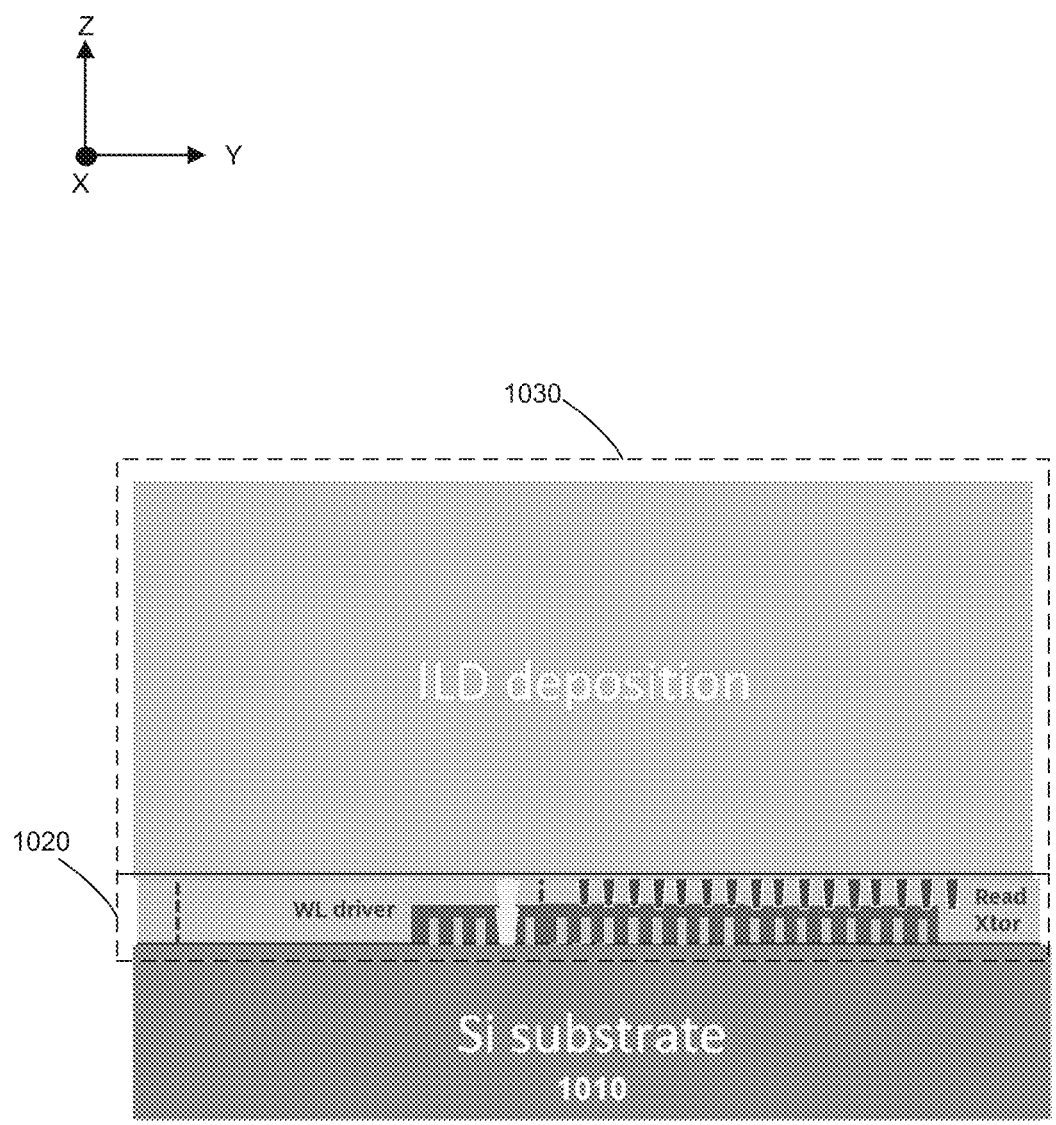

FIG. 10B depicts an example of interlayer dielectric (ILD) deposition over the structure 1020. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. ILD layer may include a silicon oxide (SiO) film, a silicon nitride (SiN) film, O3-tetraethylorthosilicate (TEOS), O3-hexamethyldisiloxane (HMDS), plasma-TEOS oxide layer, or other suitable materials.

Figure 10C:
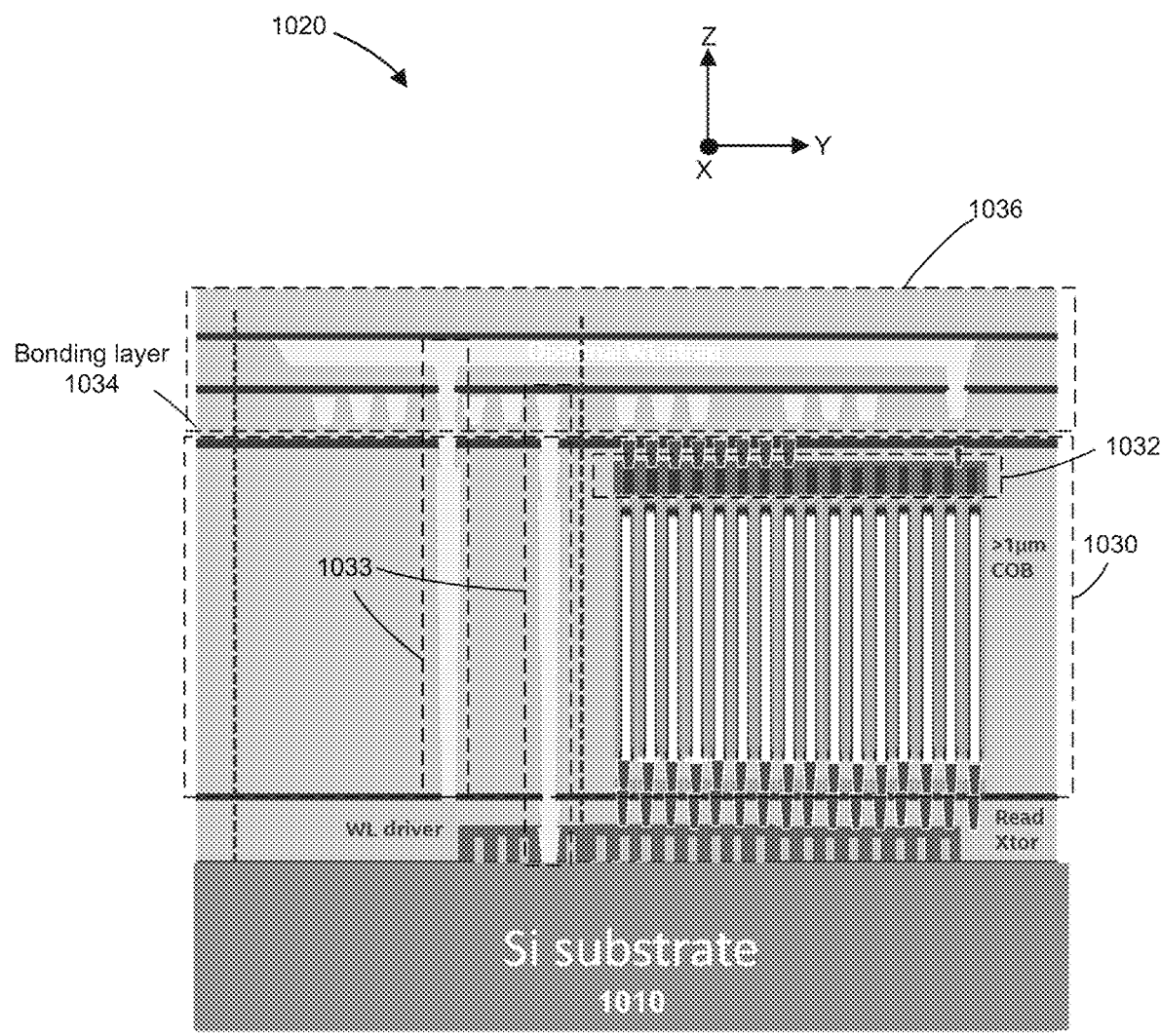

FIG. 10C depicts an example of formation of a second layer of transistors. The second layer of transistors can be formed within structure 1020. Structure 1020 can be modified to include non-silicon-based transistors such as write (MW) circuitry 1032 formed from channel materials described above with respect to metal gate 302, gate oxide 304, channel 306, source (S) and drain (D) regions. Write circuitry 1032 can be formed above and in contact with storage cells, described earlier. Signal or voltage transferring vias 1033 can also be formed in structure 1030. Sequential three-dimensional channel processing can be used to deposit or form transistors and vias within structure 1030 (e.g., at low temperature).

In some examples, a bonding layer 1034 can be used to affix structure 1036 to structure 1030. Various examples of a bonding process are described herein. Structure 1036 can include wordline (WL) straps and vias to a WL driver.

Figure 10D:
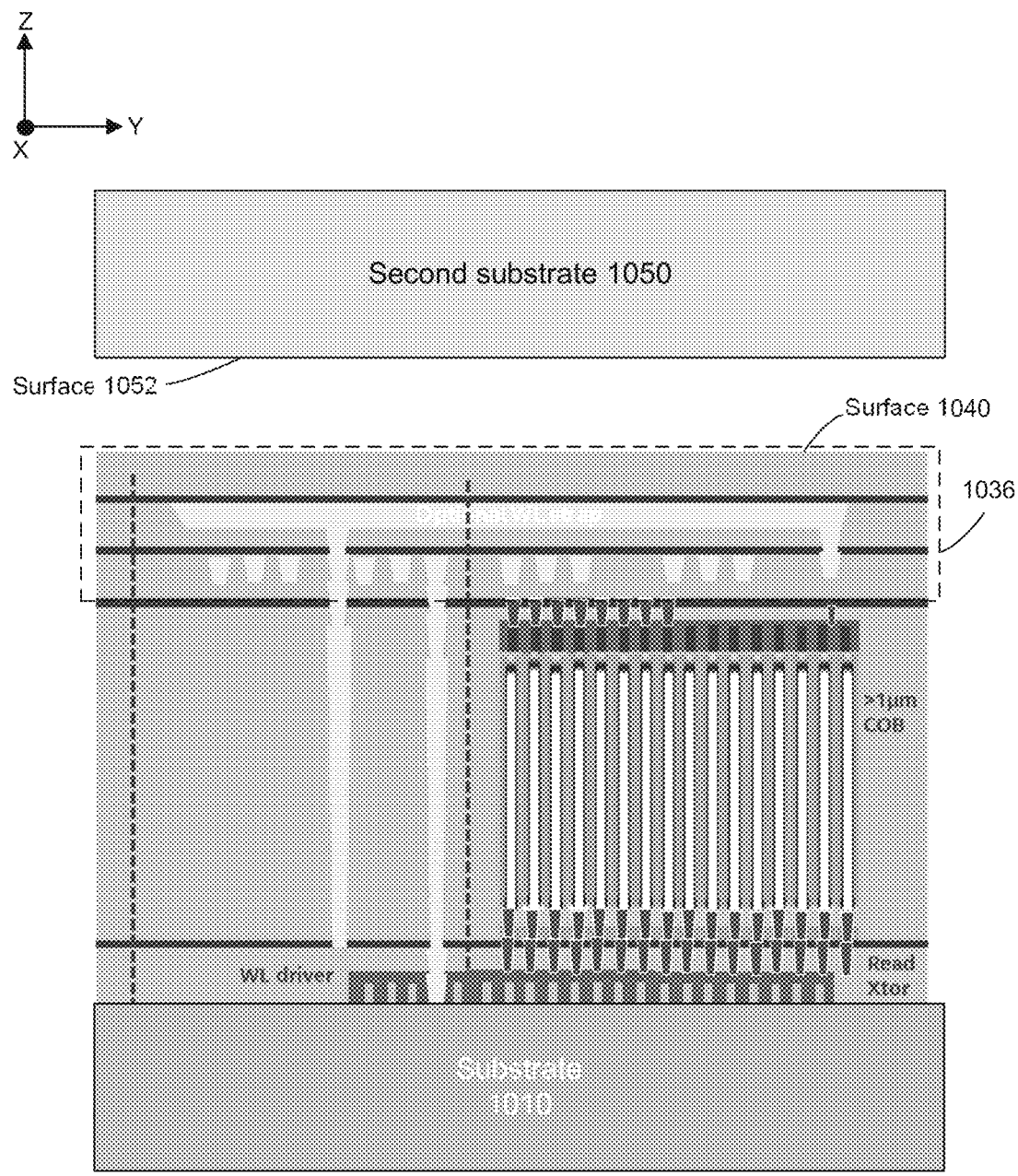

FIG. 10D depicts an example of bonding of surface 1052 of second substrate 1050 to surface 1040 of structure 1036. In some examples, surface 1040 can be covered a bonding material and surface 1052 can be covered with a bonding material. Bonding of surface 1040 to surface 1052 can occur by contact of bonding materials covering both surfaces 1040 and 1052. In some examples, bonding materials can be can include one or more of: SiO2, SiON, SiOCN, SiCN, or SiOC. Various examples of bonding surfaces are described herein. For example, second substrate 1050 can be a carrier wafer, and after bonding of second substrate 1050 to surface 1040, the resulting structure can be turned over and patterned.

Figure 10E:
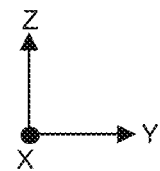
Figure 10E:
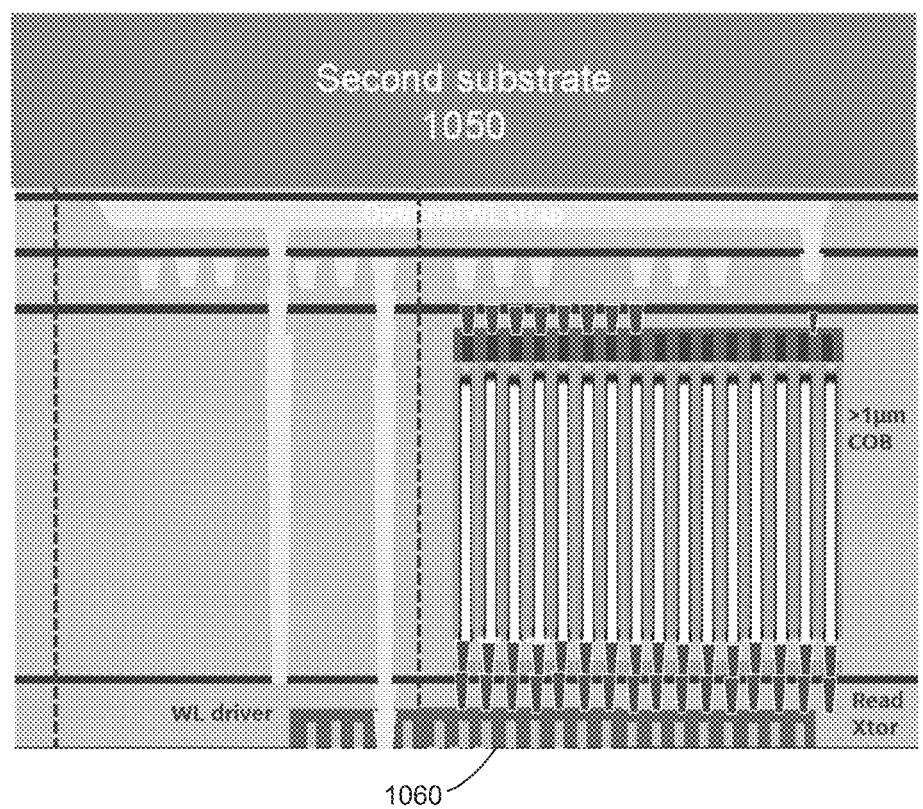

FIG. 10E depicts a structure resulting from polishing away of substrate 1010 to expose surface 1060 and in particular active fins (e.g., channel regions) of read transistors from the backside. Other techniques to remove substrate 1010 can be used such as etching or polishing or grinding.

Figure 10F:
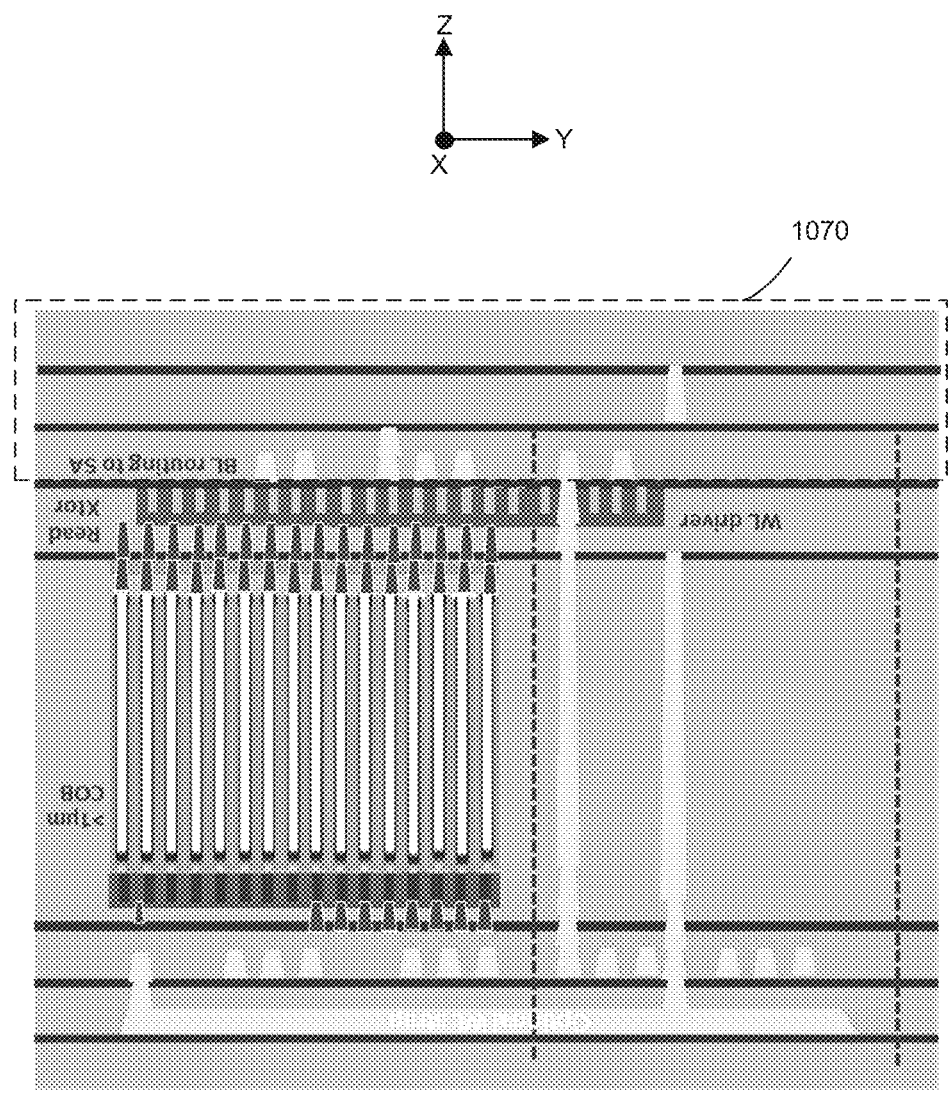

FIG. 10F depicts a structure resulting from processing of backside metals using sequential processing (instead of bonding) to create layer by layer (e.g., via etch oxide and metal) within structure 1070. Formation of structure 1070 can be performed with the wafer turned over so that structure 1070 is on top and exposed. However, in some examples, structure 1070 can be bonded to surface 1060 (FIG. 10E) in accordance with techniques described herein.

Figure 11:
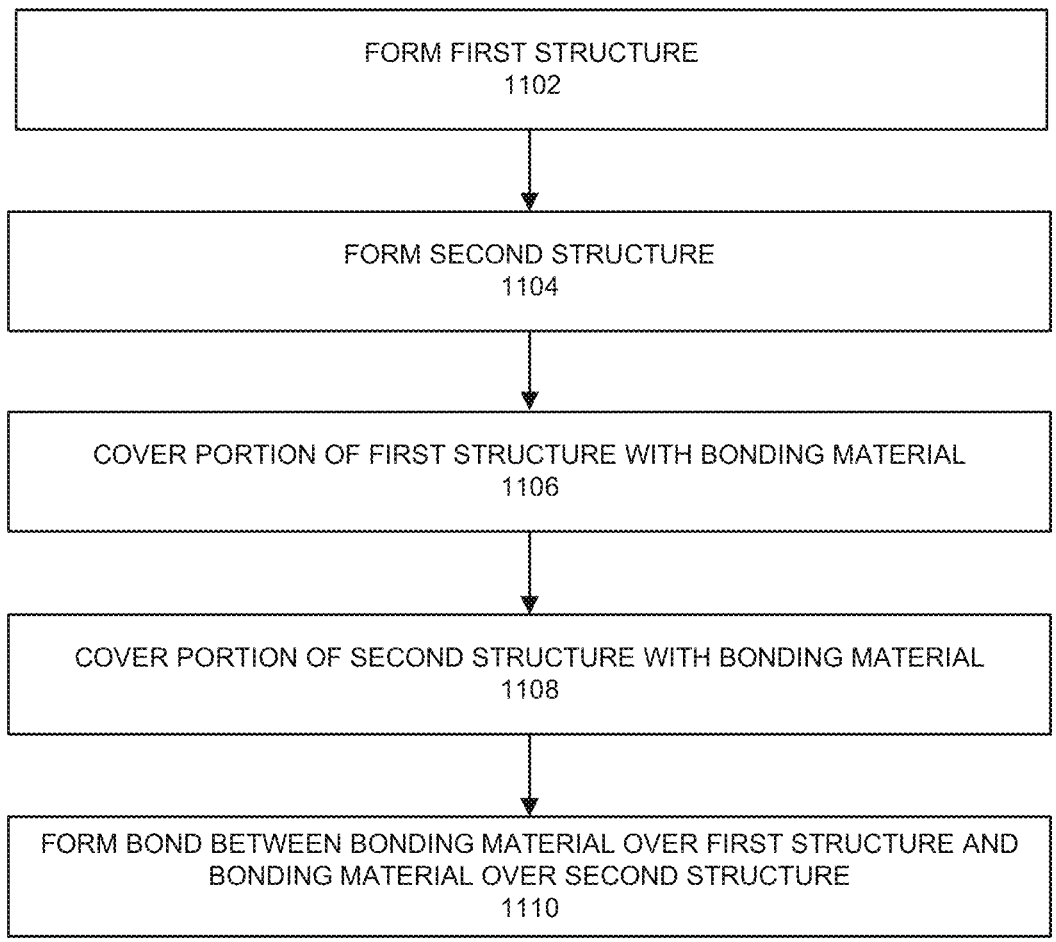
FIG. 11 depicts a process.

FIG. 11 depicts a process to form a gain cell memory device. A 1102, a first structure can be formed. For example, a first structure can include transistors of the same type (e.g., PMOS, NMOS) or CMOS transistors, and so forth. The first structure can provide a particular operation. For example, the first structure can perform an operation using one or more of: write circuitry, read circuitry, storage capacitance, sensing circuitry and peripheral logic, SRAM emulation circuitry, and so forth). The first structure can be formed using a particular group of materials and at a particular first temperature or temperature range.

At 1104, a second structure can be formed. For example, the second structure can include transistors of the same type (e.g., PMOS, NMOS) or CMOS transistors, and so forth. The second structure can provide a different operation than that of the first structure. For example, the second structure can perform an operation using one or more of: write circuitry, read circuitry, storage capacitance, sensing circuitry and peripheral logic, SRAM emulation circuitry, and so forth). The second structure can be formed using a particular group of materials and at a particular second temperature or temperature range and the second temperature or temperature range can differ from that of the first temperature or temperature range (or overlap in part with the first temperature range).

At 1106, a surface of first structure can be covered, partially or entirely, with a bonding material. For example, the surface can be a surface of the first structure that is to be bonded to the second structure. Application of the bonding material over a surface of the first structure can be performed by Physical Vapor Deposition (PVD), Chemical Vapor Deposition (CVD), Plasma-enhanced chemical vapor deposition (PECVD), Atomic Layer Deposition (ALD), Plasma Enhanced Atomic Layer Deposition (PEALD), spin-on, wet deposition processes, or other similar process. A bonding material can include one or more of: silicon dioxide (SiO2), silicon oxynitride (SiON), carbon doped-silicon oxynitride (SiOCN), silicon carbon nitride (SiCN), or silicon oxycarbide (SiOC).

At 1108, a surface of second structure can be covered, partially or entirely, with a bonding material. For example, the surface can be a surface of the second structure that is to be bonded to the first structure. Application of the bonding material over a surface of the second structure can be performed by Physical Vapor Deposition (PVD), Chemical Vapor Deposition (CVD), Plasma-enhanced chemical vapor deposition (PECVD), Atomic Layer Deposition (ALD), Plasma Enhanced Atomic Layer Deposition (PEALD), spin-on, wet deposition processes, or other similar process. A bonding material can include one or more of: silicon dioxide (SiO2), silicon oxynitride (SiON), carbon doped-silicon oxynitride (SiOCN), silicon carbon nitride (SiCN), or silicon oxycarbide (SiOC).

At 1110, a bonding material portion on the first structure can be bonded to a bonding material portion on the second structure. For example, a bond can be formed between the bonding material on the first structure with the bonding material on the second structure. For example, to form a bond between bonding materials of different surfaces, (1) the bond can be activated by preparing the surfaces with a plasma treatment (e.g., exposure of high energy ions of nitrogen, argon, oxygen, NH3, Cl, F2 and the like) that creates broken or dangling bonds, (2) aligning surfaces, and (3) and pressing surfaces against each other at a temperature ranging from, e.g., room temperature to 400° C.

Figure 12A:
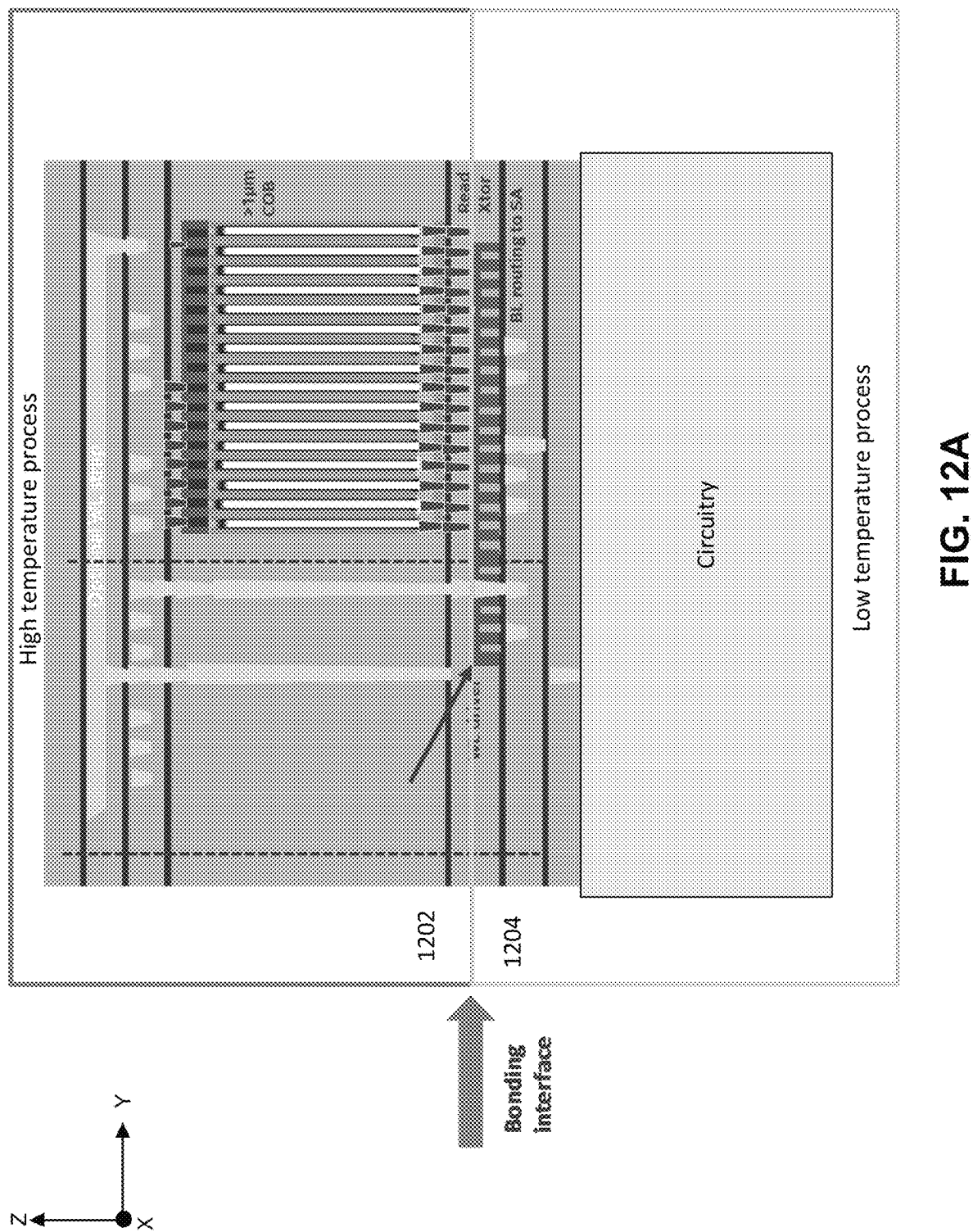
FIGS. 12A-12C depict cross-sectional views of a gain cell memory device.

FIG. 12A depicts another cross-sectional view of a gain cell memory device. In this example, a bonding interface using techniques described herein is used to bond and conductively couple capacitor storage devices of structure 1202 to read transistors of structure 1204. In this example, structure 1202 can be formed at a relatively higher temperature than that used to form structure 1204, although the opposite can be applied.

Figure 12B:
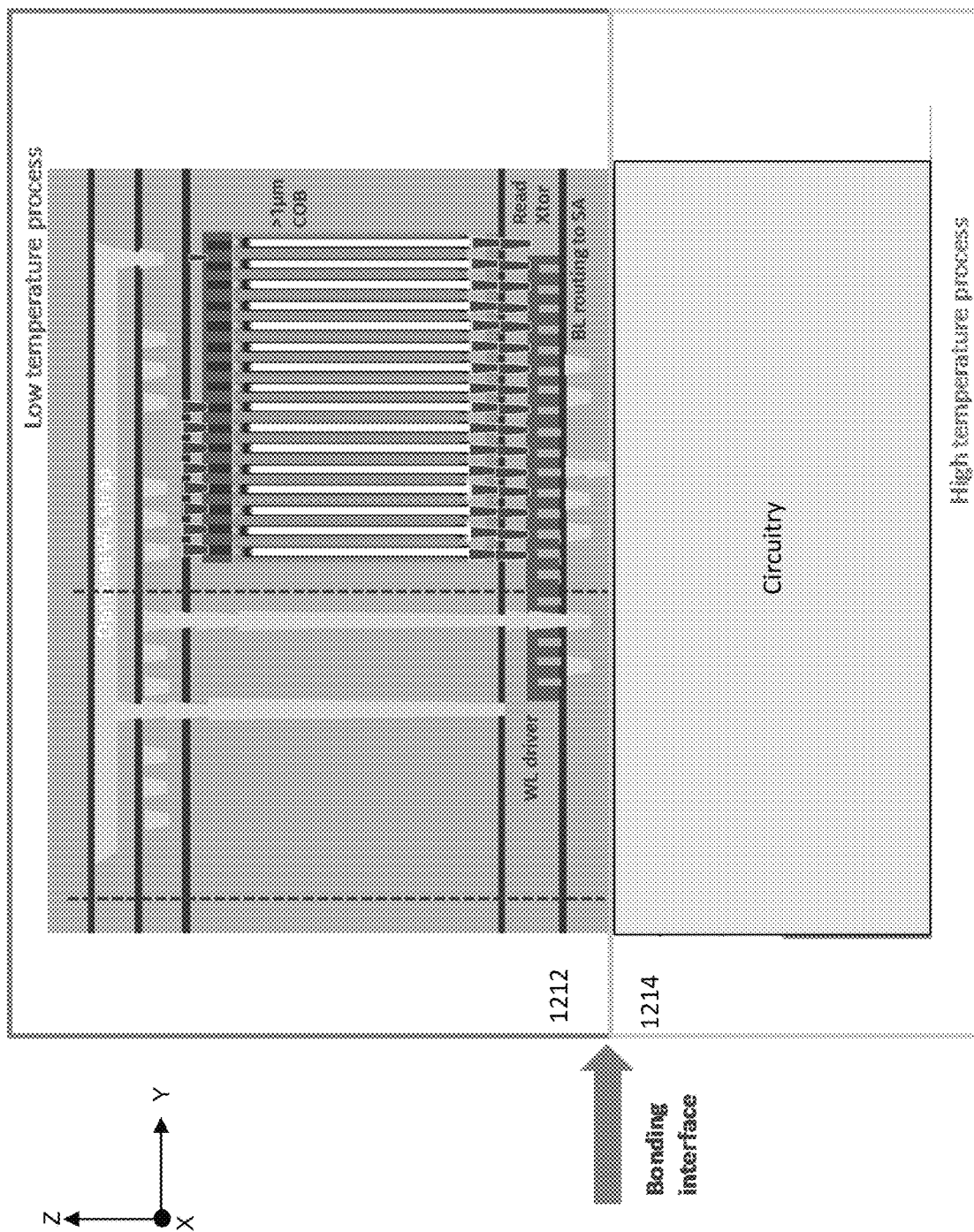

FIG. 12B depicts another cross-sectional view of a gain cell memory device. In this example, a bonding interface using techniques described herein is used to bond structure 1212 to structure 1214. For example, structure 1212 can include gain cell eDRAM memory devices including write and read circuitry whereas structure 1214 can include various circuitry described herein. In this example, structure 1212 can be formed at a relatively lower temperature than that used to form structure 1214, although the opposite can be applied.

Figure 12C:
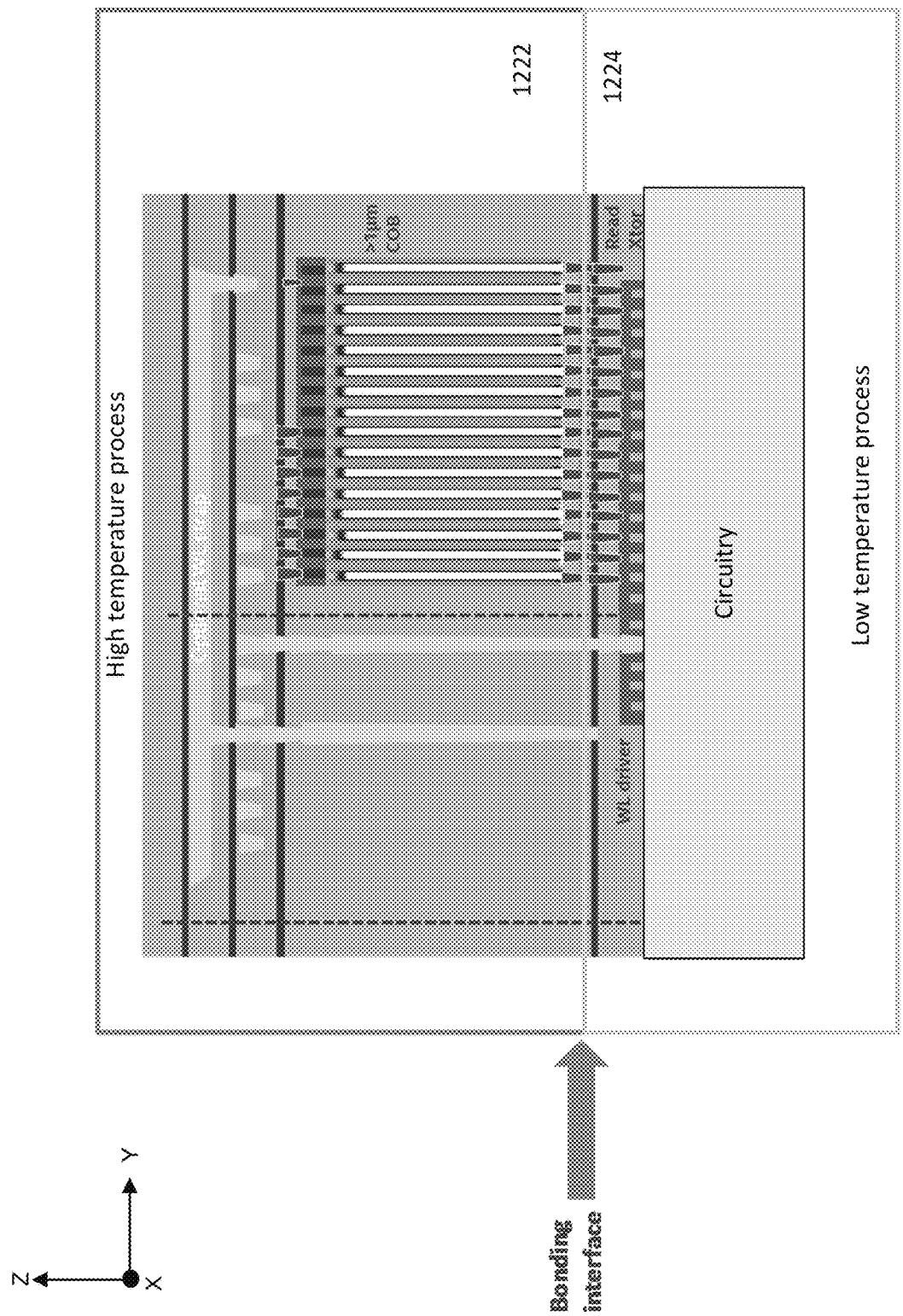

FIG. 12C depicts another cross-sectional view of a gain cell memory device. In this example, a bonding interface using techniques described herein is used to bond structure 1222 to structure 1224. For example, structure 1222 can include gain cell eDRAM memory devices whereas structure 1224 can include read circuitry and various circuitry described herein. In this example, structure 1222 can be formed at a relatively higher temperature than that used to form structure 1224, although the opposite can be applied.

Figure 13:
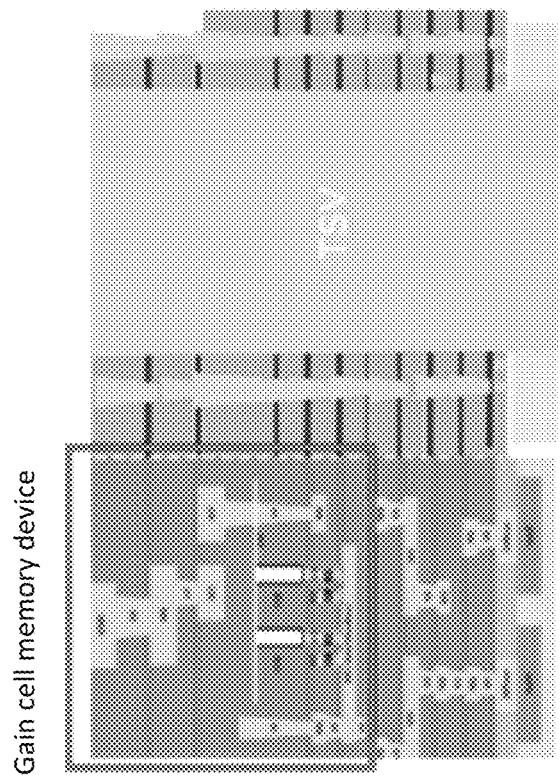
FIG. 13 depicts another cross-sectional view of a gain cell memory device.

FIG. 13 depicts another cross-sectional view of a gain cell memory device. eDRAM memory can be implemented in backend metallization layers and stacked over memory access and control logic and CNM circuits. A through silicon via (TSV) can be formed next to the memory stack. A hermetic enclosure can be formed around the memory stack to separate the memory stack from the TSV.

Figure 14:
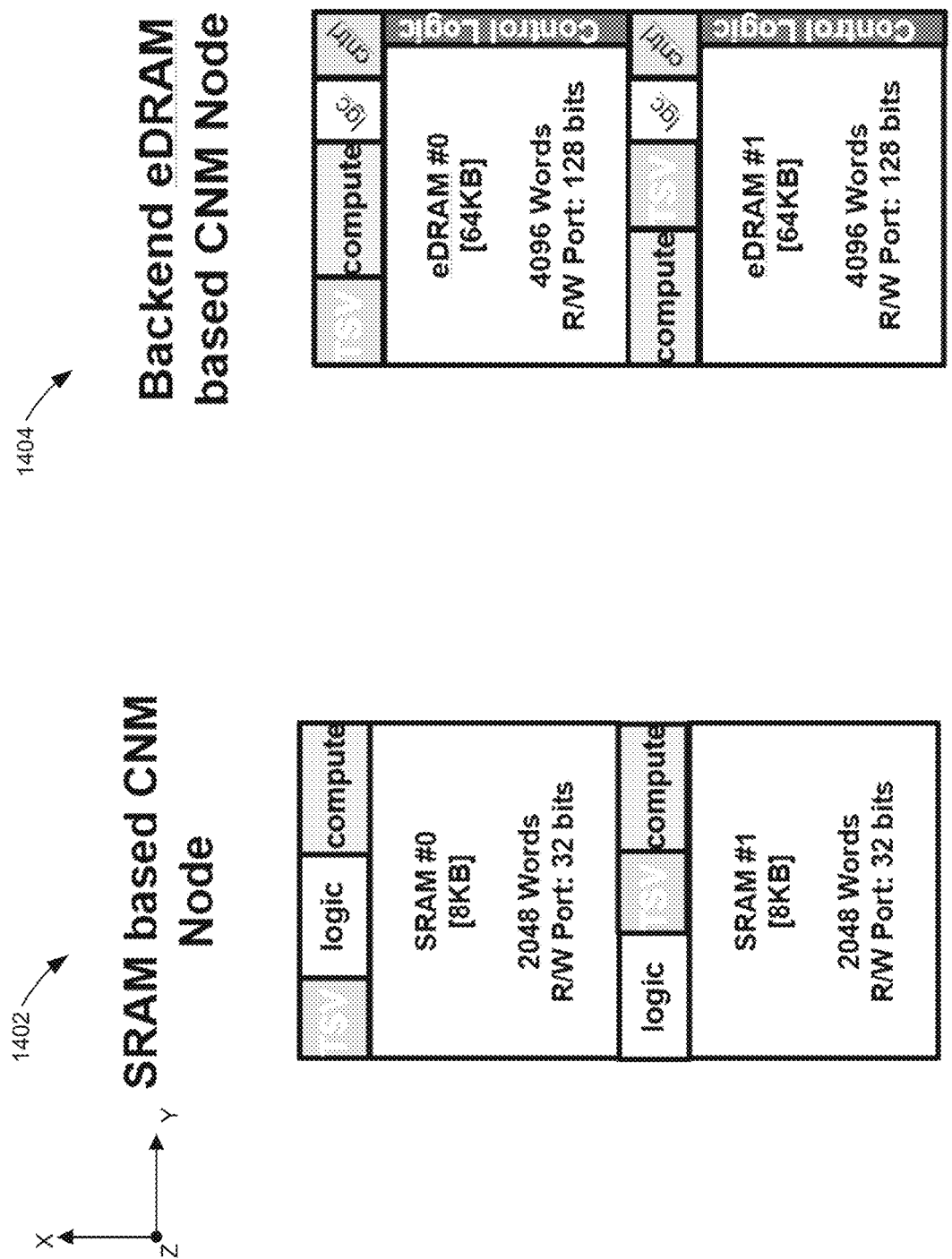
FIG. 14 depicts an example of top down view of various devices.

FIG. 14 depicts an example of top down view of various devices. For system 1402, an SRAM memory is used to store data used by CNM or generated by CNM. System 1404 is a top down view of a CNM floorplan with eDRAM tightly coupled with Processing Elements (PE) and TSVs for power delivery. For system 1404, a backend gain cell eDRAM device can be used instead of an SRAM to store data read from or written by CNM.

In some examples, to use a gain cell eDRAM device in place of an SRAM device, circuitry is added for a gain cell eDRAM device to emulate at least an output of an SRAM device. A gain cell eDRAM device can have much slower read access times than those of a SRAM device but provide higher density of memory cells and thereby store more data for a same X-Y plane footprint as that of the SRAM device. In some examples, a gain cell eDRAM device can include multiple memory banks and data can be stored across multiple memory banks so that reading of data can be initiated on successive clock cycles and despite slower read times for eDRAM devices compared that those of SRAM devices, data can be available at or about the same throughput as that of SRAM devices. In some examples, time-interleaving access circuits are implemented on the active silicon, shown with "lgc" (logic) sections.

Circuitry to allow an eDRAM to emulate an SRAM device can be placed under backend memory in the Z direction to save X-Y plane footprint or be placed next to the eDRAM device and use additional X-Y plane footprint.

FIG. 14 shows an example implementation of a CNM circuit module using backend embedded DRAM memory partitions instead of or in addition to an SRAM device. Various embodiments provide an eDRAM device that provides the same operations per second (OPS), throughput, and near-memory bandwidth as those of SRAM. To match the same throughput and performance (in terms of OPS), eDRAM banks provide the same on-die bandwidth to the processing engines as that of the SRAM memory banks. However, DRAM row-access can be slower than SRAM row-access latency as eDRAM uses capacitors to access data so slower than SRAM. Various embodiments provide for time multiplexed memory bank accesses to be performed.

Figure 15:
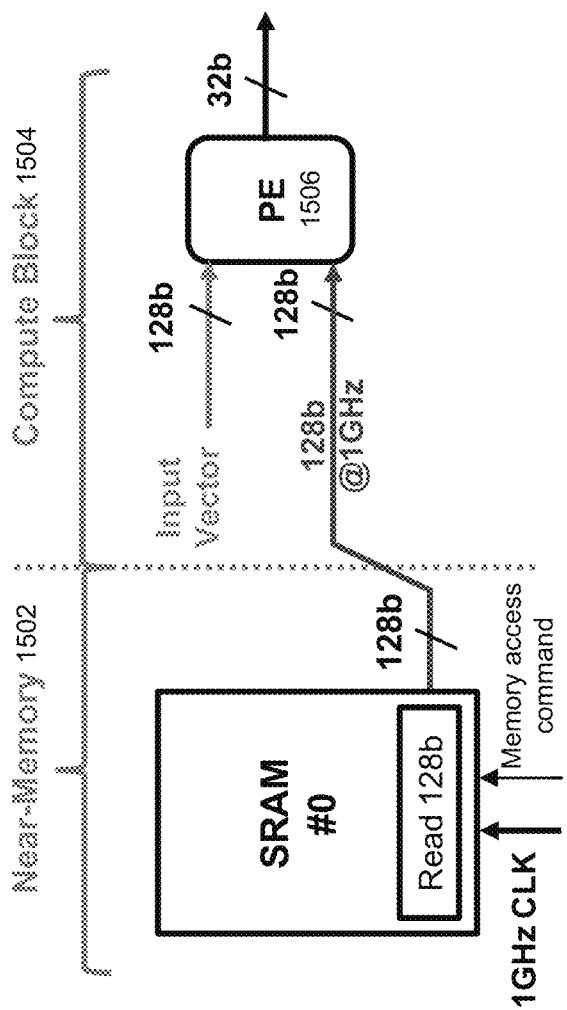
FIG. 15 depicts an example logical block diagram of a system with near-a memory and a near-memory compute block.

FIG. 15 depicts an example logical block diagram of a system with near-memory and compute block. In this example, near-memory 1502 is an SRAM device that receives a memory access command and a clock signal (e.g., 1 GHz or other frequencies). In this example, the memory access command is a read command that causes reading out of 128 bits of data, although any sizes of data can be read out. The SRAM outputs 128 bits of data timed at a clock edge of the clock signal. Processing element (PE) 1506 of compute block 1504 receives the data from the SRAM device and performs computations using an input vector. For example, the data can be a weight and PE 1506 can perform multiplication of the weight with the input vector as part of a matrix multiplication as part of a neural network used in machine learning (ML) or artificial intelligence (AI) applications for training or inference.

In some cases, DRAM banks can provide more data storage than that of an SRAM device for the same X-Y plane footprint area. Various embodiments provide emulator circuitry for a DRAM device so that the DRAM device can provide output data at the same throughput as that of the SRAM device.

Figure 16:
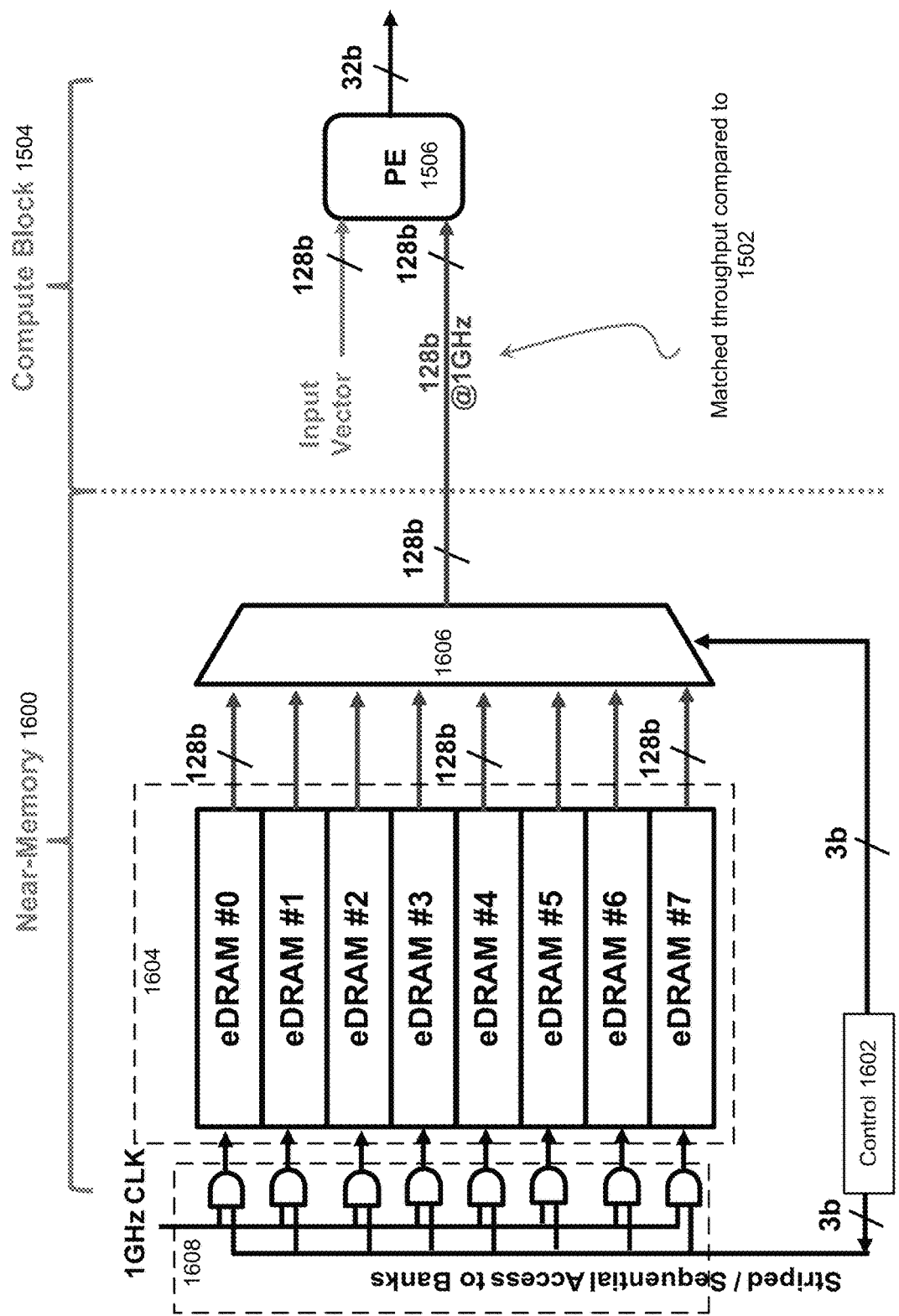
FIG. 16 depicts an example system in which circuitry can be used for a memory of a first memory type to emulate output of another memory type.

FIG. 16 depicts an example system in which circuitry can be used for a memory of a first memory type to emulate output of another memory type. For example, memory 1604 can include multiple banks of eDRAM devices. An eDRAM device bank can include storage units that are addressable as rows and columns and can be within one or multiple devices. Control circuitry 1602 can time-interleave data access requests made to eDRAM banks to achieve similar output (read) bandwidth compared to an SRAM embodiment. Control circuitry 1602 can control transfer of memory access signal (e.g., read or write) to a memory bank eDRAM #0 to eDRAM #7 over successive clock cycles. Other numbers of memory banks can be used. For example, during a first clock cycle, a memory access can be transferred to eDRAM #0; during a second clock cycle (e.g., next or subsequent), a memory access can be transferred to eDRAM #1, and so forth.

In some examples, control circuitry 1602 can transfer memory access command to gating circuitry 1608. Gating circuitry 1608 can receive the same clock signal as would have been provided to a different type of memory device (e.g., SRAM) and also receive the memory access command. Gating circuitry 1608 can transfer the memory access command on an edge (e.g., rising or falling) of the clock signal and cause the memory access command to be transferred in an interleaved manner to whichever of eDRAM #0 to eDRAM #7 are to be accessed.

For example, for a read of addresses 0 and 1 in SRAM, data stored at address 0 can be accessed at clock cycle 0 and data in address 1 can be accessed during a next clock cycle 1 even from the same memory bank. But eDRAM can provide slower read times (e.g., higher read latency) compared to those of SRAM. Storing data in address 0 and address 1 of eDRAM #0 bank could involve multiple clock cycles to retrieve data from both addresses. In some examples, data to be accessed consecutively can be stored in different eDRAM banks. Accordingly, data at address 0 can be stored in eDRAM #0 bank and data at address 1 can be stored in eDRAM #1 bank. For example, if weight values are to be retrieved consecutively, weight values can be stored in different memory banks. For faster access, data can be striped across multiple DRAMs for parallel access. However, if slower access is permitted, data can be stored in a single bank and accessed consecutively. Accordingly, to access data at a speed commensurate to SRAM speeds (i.e. at matching throughputs), data can be accessed from eDRAM banks in parallel or in successive clock cycles. If a read from a memory bank takes several clock cycles to complete, an access of address 0 from eDRAM #0 can precede an access of address 1 from eDRAM #1. In some examples, control circuitry 1602 can use a most significant bit of a memory address to select which DRAM bank is accessed.

In some examples, control circuitry 1602 can stagger requests transferred to memory 1604 to reduce an amount of buffering of received data from memory banks to reduce a size of memory buffer used to buffer read-out data. Memory banks of memory 1604 can provide data to multiplexer 1606 and control circuitry 1602 can control data from which bank is transferred to a processing element 1506 of compute block 1504.

Figure 17:
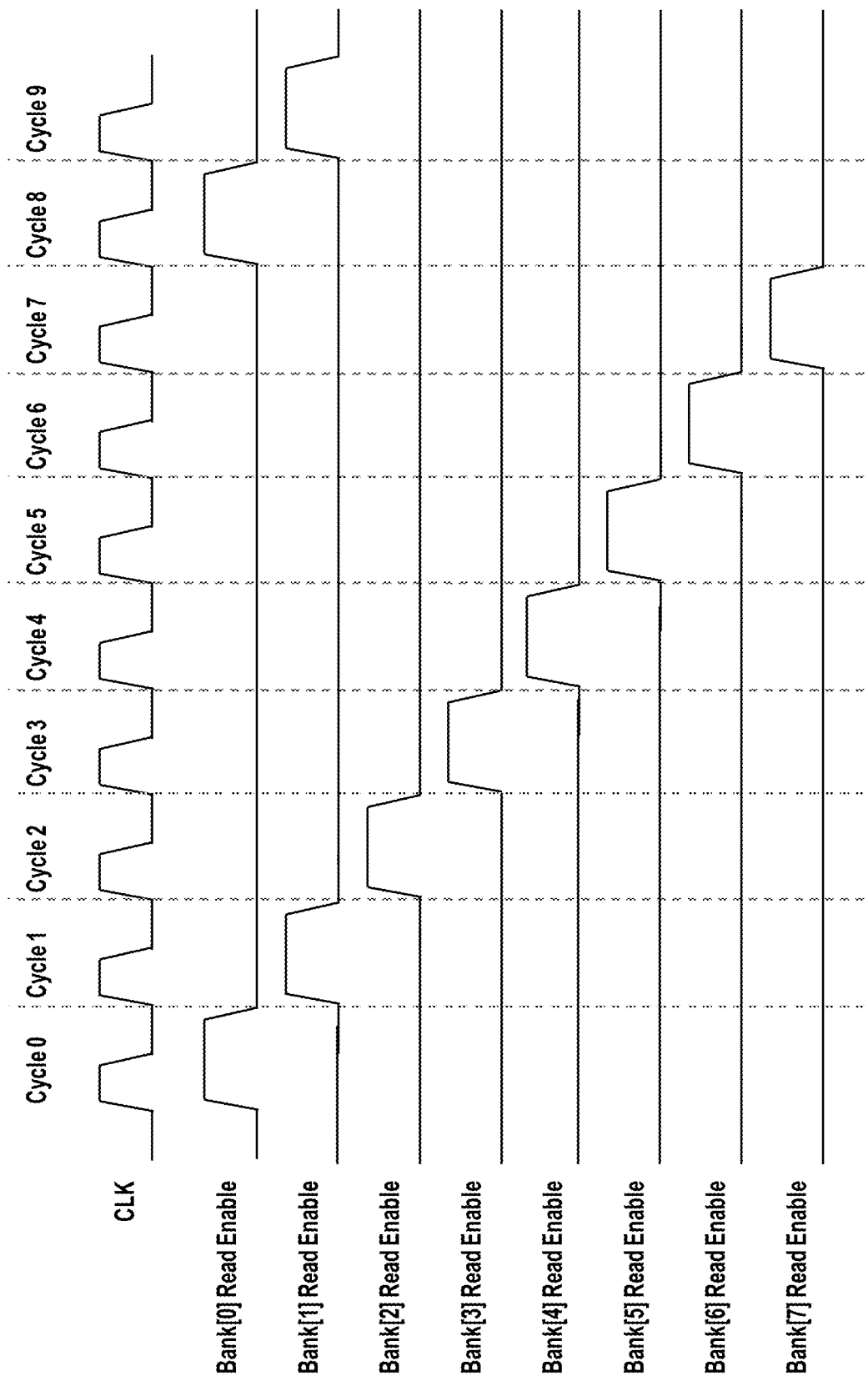
FIG. 17 depicts an example of signals that can be transferred for accesses to multiple banks.

FIG. 17 depicts an example of signals that can be transferred for accesses to multiple banks. In this example, memory banks 0 to 7 are to be accessed to read data from those banks. In order to read data from banks 0 to 7, gating circuitry 1608 can transfer a read enable signal to memory bank 0 at a rising edge of clock cycle 0, a read enable signal to memory bank 1 at a rising edge of clock cycle1, and so forth. While this example shows transfer of read requests to all memory banks, not all available memory banks are to be accessed for all read requests. The memory banks to be accessed depends on which memory bank stores data to be accessed. Data can be stored in multiple memory banks to permit time-interleaved access whereby multiple read operations overlap partially in time.

Referring to FIG. 16, PE 1506 performs a dot-product operation by performing Vector-Vector multiplication, and receives data from a near-memory with binary or multi-bit elements at 1 GHz clock frequency. Other examples of operations of CNM circuits include multiplication and accumulation (MAC), Binary operations (AND, OR, XOR, NOT) (e.g., for binary arithmetic, bit-serial operations, bit blit, or hyper-dimensional computing), single- or multi-batch matrix-matrix or matrix-vector dot-product operations, neural network activation functions such as ReLu, tanh, sigmoid, exponentiation for soft-max, data compression, encryption, media accelerators, string matching or regular expression accelerators, or pointer chasing circuits. PE 1506 can be any type of fixed or configurable function device.

Figure 18:
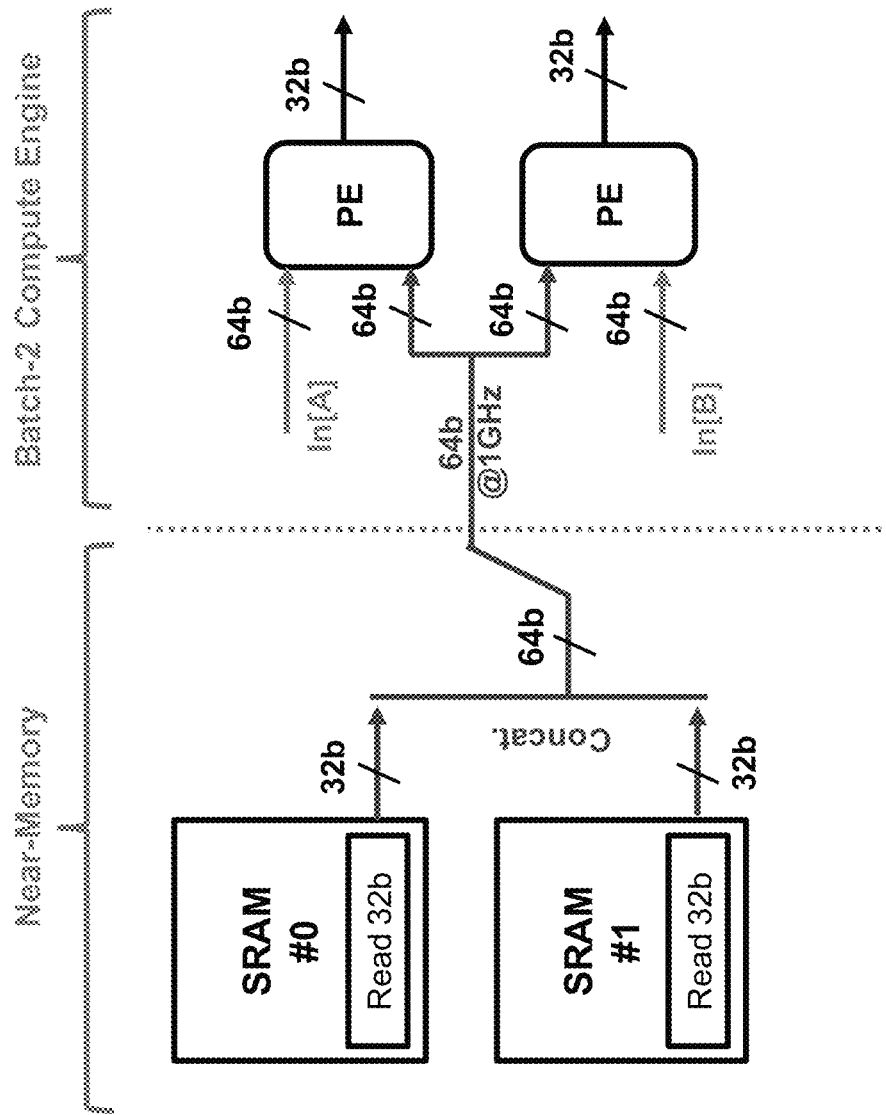
FIG. 18 shows an example system whereby multiple SRAM banks are accessed and data from the banks are concatenated or combined to provide data to a compute engine.

FIG. 18 shows an example system whereby multiple SRAM banks are accessed and data from the banks are concatenated or combined to provide data to a compute engine. In this example, compute engine performs batch-2 vector-vector dot-product operations. For example, in a clock edge or edges (e.g., rising or falling), an SRAM bank #0 and SRAM bank #1 can provide data that are combined to provide a concatenated data segment. Concatenation of data can occur using a memory buffer (not shown). In this example, SRAM bank #0 and SRAM bank #1 can both provide 32b data and the 32b data are combined and provided as a 64b (64 bit) value. The 64b value can be a single element of bit-width 64b (e.g., integer or floating point representation), or it can be a vector of multiple elements of sizes 1bit (e.g., binary representation), 2bits (e.g. ternary representation for {−1, 0, +1} values), or multi-bit (e.g., multi-bit integer or floating point representation) elements. Other sizes of data can be used or combined. The combined value can be provided to one or multiple processing elements (PEs) for parallelism.

In some examples, data output from an SRAM can be combined or concatenated with data from an eDRAM bank. For example, in FIG. 18, SRAM #0 can be replaced with a DRAM bank with circuitry to emulate operation as an SRAM device and SRAM #1 can be an SRAM device.

Figure 19:
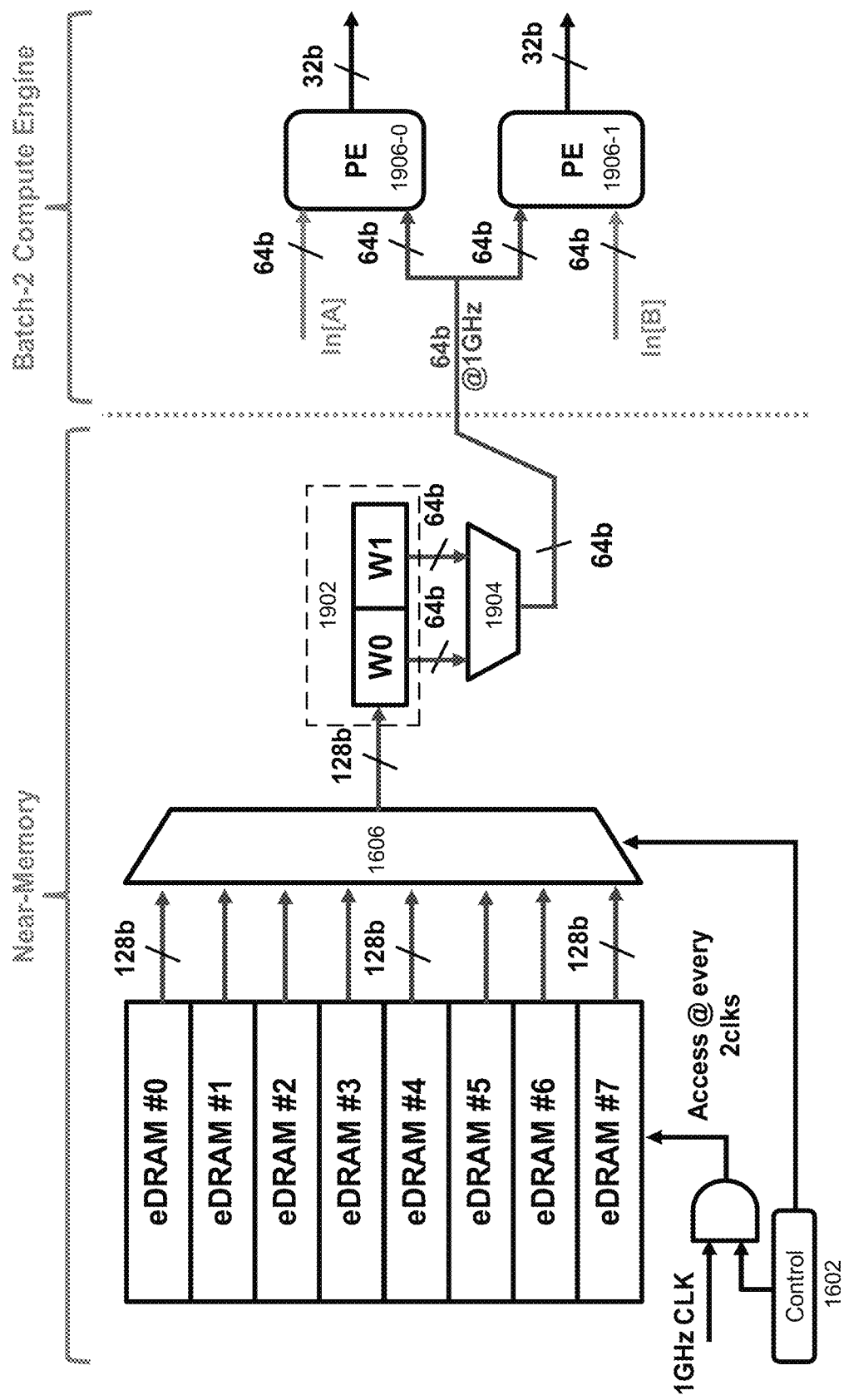
FIG. 19 depicts an example of an embedded DRAM memory whereby data output from the embedded DRAM memory are divided and provided to multiple processing elements (PEs).

FIG. 19 depicts an example of an embedded DRAM memory whereby data output from the embedded DRAM memory are provided to multiple processing elements (PEs). For example, a 128 bit value provided by multiplexer 1606 can be stored as W0 and W1 in a buffer 1902. In this example, W0 and W1 can both be 64 bits in size or other sizes. Multiplexer 1904 can transfer either W0 or W1 at a clock edge to PE 1906-0 and 1906-1. For example, an output from multiplexer 1904 can be controlled by the least significant bit of the accessed address.

In some examples, one or more of control 1602, multiplexer 1606, circuitry 1608, multiplexer 1904 as well as signal conductive paths can be placed under the eDRAM memory device in the Z-direction to save X-Y footprint. In some examples, one or more of control circuitry 1602, multiplexer 1606, circuitry 1608, multiplexer 1904 as well as signal conductive paths can be placed to the side of eDRAM memory device in the X-Y plane.

Figure 20:
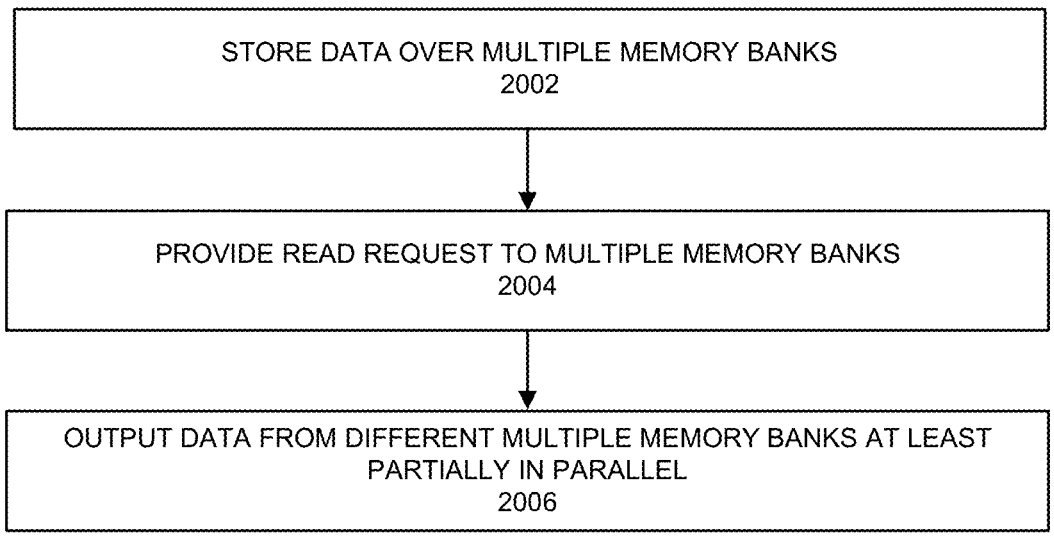
FIG. 20 depicts an example process to read out data from a memory device at speeds that emulate a faster memory device.

FIG. 20 depicts an example process to read out data from a memory device at speeds that emulate a faster memory device. At 2002, data that is to be accessed in consecutive read accesses are stored in different memory banks of a memory device. The data can be stored in different eDRAM memory banks where the different eDRAM memory banks are accessible to be read-from in the same or different clock cycles.

At 2004, a read request is provided to different memory banks of the memory device to provide for at least partially time-overlapping read operations. For example, a read request can be propagated to a memory bank in a first clock edge and the read request can be propagated to a different memory bank in a subsequent clock edge.

At 2006, data from different memory banks can be output at least partially in parallel. A data output rate from the different memory banks can emulate a data output rate of a second memory device. For example, data can be multiplexed after output from eDRAM memory banks to a compute block in a manner that emulates a speed of data output (e.g., SRAM) to a processor element to match the throughput of SRAM.

Various embodiments are applicable to any process technology, and to any number of memory partitions. The batch-2 dot-product engine is given as an example, and the backend eDRAM memory-access technique shown here is applicable to any type of compute block, bit-width, number of elements, and so forth. Access circuits can be physically laid out right under the backend eDRAM arrays to save area and wire resources.

Figure 21:
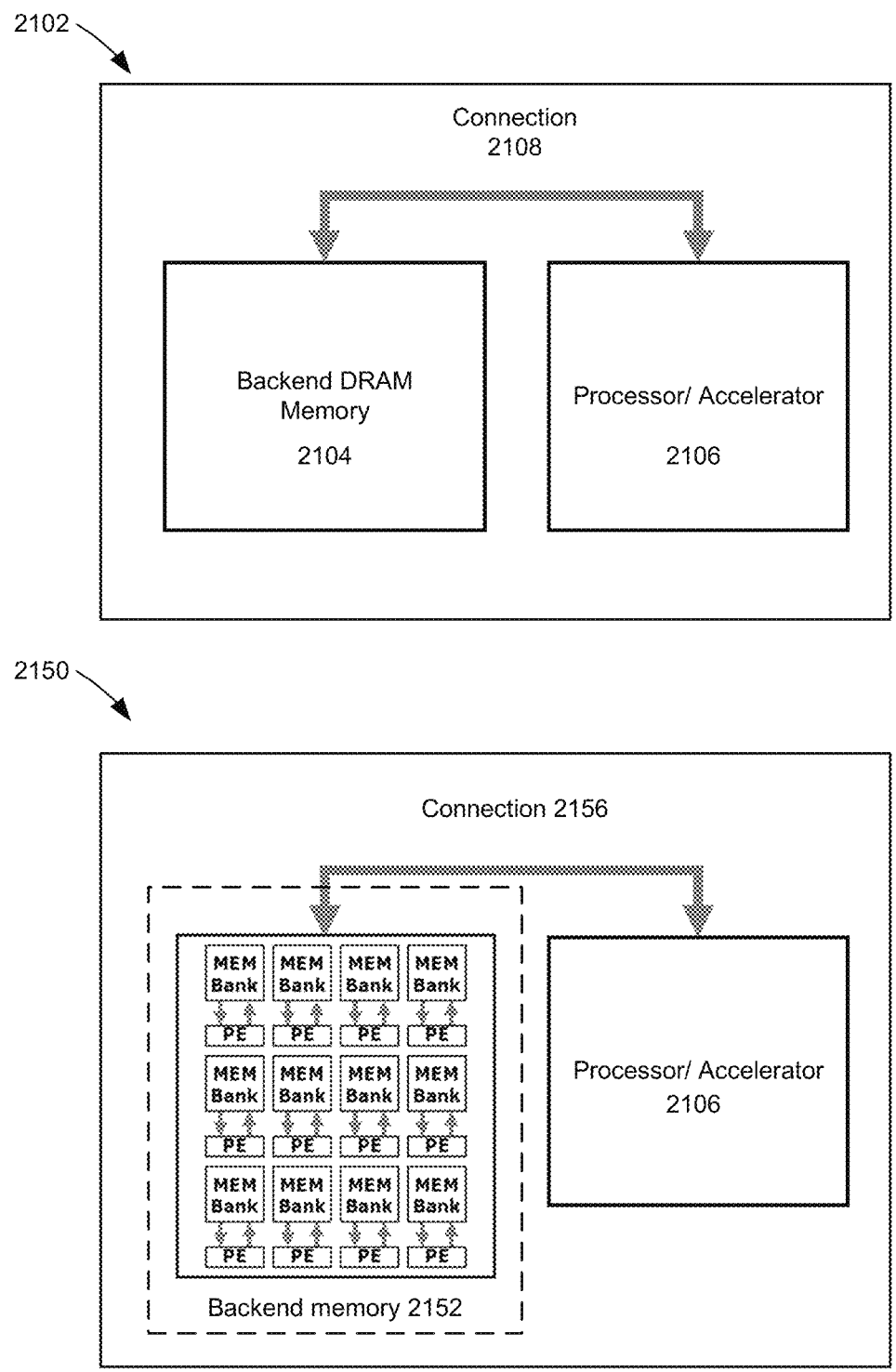
FIG. 21 depicts an example of various systems.

FIG. 21 depicts an example of various systems. System 2102 includes a memory 2104 connected to a processor or accelerator 2106 using a connection 2108. Backend DRAM memory 2104 can be formed using techniques described herein and provide data to processor or accelerator 2106 using a bus or other interconnect or receive data from processor or accelerator 2106 using a bus or other interconnect. Connection 2108 can be Embedded Multi-die Interconnect Bridge (EMIB) or a chip-to-chip interconnect.

System 2150 is another configuration whereby backend memory 2152 can include a memory bank with processing element formed in the same silicon die. For example, a memory bank can be bonded to a processing element in accordance with techniques described herein. Multiple memory bank and processing element pairs can be formed within a backend memory device whereby multiple memory banks can be bonded to multiple processing elements in accordance with techniques described herein.

A processing element can be a CNM circuitry that processes content from a memory bank and provides an output to a process or accelerator or stores a result into memory. In some examples, multiple DRAM memory systems can be connected through a bus, interconnect, network or fabric for service chain processing whereby one device processes data and provides data to another device to store and process. Various embodiments of a memory bank and PE can be an eDRAM and a CNM constructed in a manner described herein. Various embodiments of a memory bank can be an eDRAM with circuitry that allows an eDRAM to emulate operation of an SRAM device.

Backend memory 2152 can be connected to processor or accelerator device 2154 using connection 2156. Connection 2156 can be Embedded Multi-die Interconnect Bridge (EMIB) or a chip-to-chip interconnect. Processor or accelerator device 2106 can be any type of device such as a general-purpose or special-purpose microprocessor, CPU, GPU, digital signal processor (DSP), programmable controller, application specific integrated circuit (ASIC), programmable logic device (PLD), or the like, or a combination of such devices.

Figure 22:
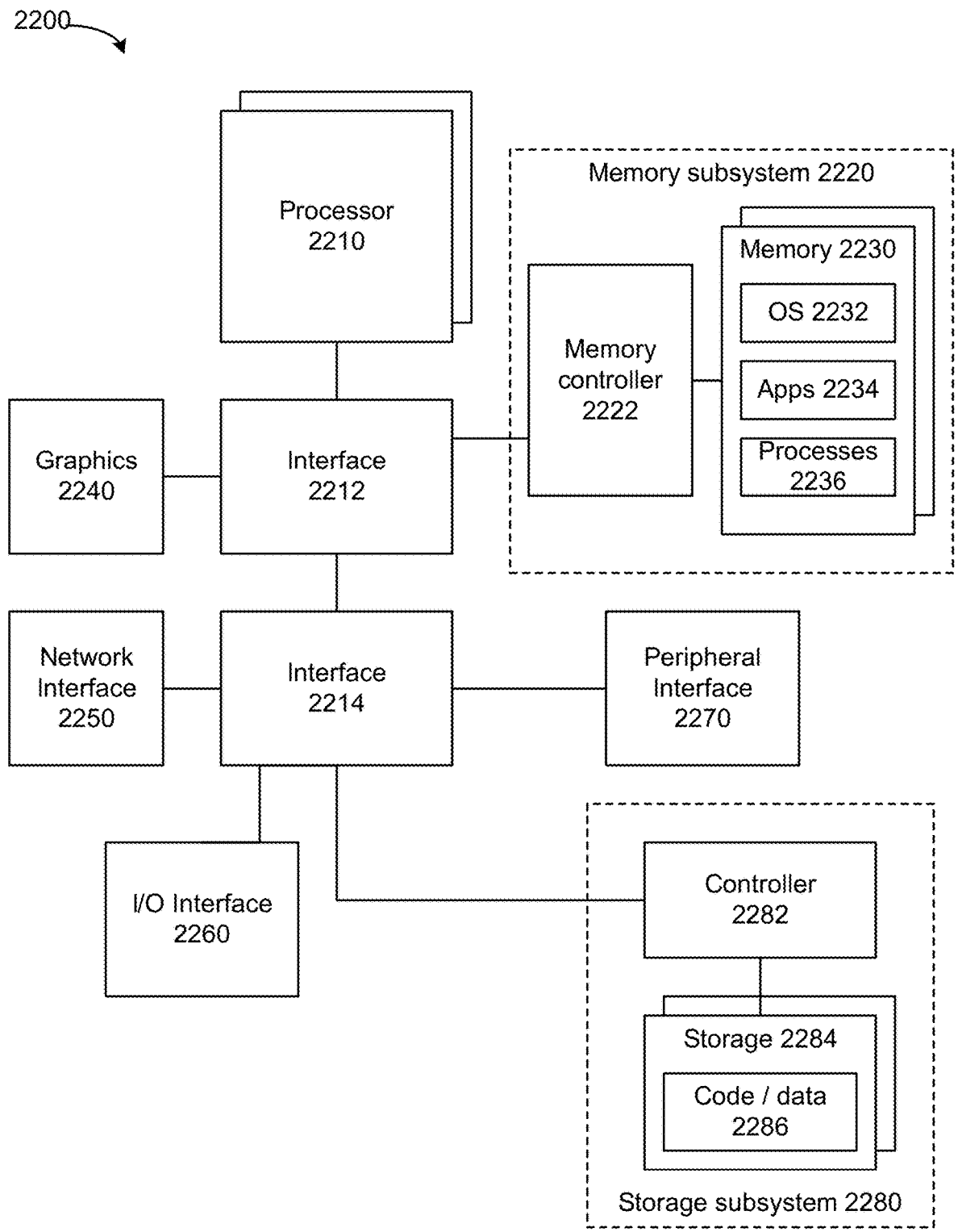
FIG. 22 depicts a system.

FIG. 22 depicts a system. The system can use embodiments described herein whereby a memory device include CNM features formed in a manner described herein or with SRAM-emulation circuitry. System 2100 includes processor 2110, which provides processing, operation management, and execution of instructions for system 2100. Processor 2110 can include any type of microprocessor, central processing unit (CPU), graphics processing unit (GPU), processing core, or other processing hardware to provide processing for system 2100, or a combination of processors. Processor 2110 controls the overall operation of system 2100, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 2200 includes interface 2212 coupled to processor 2210, which can represent a higher speed interface or a high throughput interface for system components that needs higher bandwidth connections, such as memory subsystem 2220 or graphics interface components 2240, or accelerators 2242. Interface 2212 represents an interface circuit, which can be a standalone component or integrated onto a processor die. Where present, graphics interface 2240 interfaces to graphics components for providing a visual display to a user of system 2200. In one example, graphics interface 2240 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 2240 generates a display based on data stored in memory 2230 or based on operations executed by processor 2210 or both. In one example, graphics interface 2240 generates a display based on data stored in memory 2230 or based on operations executed by processor 2210 or both.

Accelerators 2242 can be a programmable or fixed function offload engine that can be accessed or used by a processor 2210. For example, an accelerator among accelerators 2242 can provide compression (DC) capability, cryptography services such as public key encryption (PKE), cipher, hash/authentication capabilities, decryption, or other capabilities or services. In some embodiments, in addition or alternatively, an accelerator among accelerators 2242 provides field select controller capabilities as described herein. In some cases, accelerators 2242 can be integrated into a CPU socket (e.g., a connector to a motherboard or circuit board that includes a CPU and provides an electrical interface with the CPU). For example, accelerators 2242 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 2242 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 2220 represents the main memory of system 2200 and provides storage for code to be executed by processor 2210, or data values to be used in executing a routine. Memory subsystem 2220 can include one or more memory devices 2230 such as read-only memory (ROM), flash memory, one or more varieties of random access memory (RAM) such as DRAM, or other memory devices, or a combination of such devices. Memory 2230 stores and hosts, among other things, operating system (OS) 2232 to provide a software platform for execution of instructions in system 2200. Additionally, applications 2234 can execute on the software platform of OS 2232 from memory 2230. Applications 2234 and OS 2232 can be executed within a virtual machine environment or container environment with distinct allocated memory regions. Applications 2234 represent programs that have their own operational logic to perform execution of one or more functions. Processes 2236 represent agents or routines that provide auxiliary functions to OS 2232 or one or more applications 2234 or a combination. OS 2232, applications 2234, and processes 2236 provide software logic to provide functions for system 2200. In one example, memory subsystem 2220 includes memory controller 2222, which is a memory controller to generate and issue commands to memory 2230. It will be understood that memory controller 2222 could be a physical part of processor 2210 or a physical part of interface 2212. For example, memory controller 2222 can be an integrated memory controller, integrated onto a circuit with processor 2210.

While not specifically illustrated, it will be understood that system 2200 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 2200 includes interface 2214, which can be coupled to interface 2212. In one example, interface 2214 represents an interface circuit, which can include standalone components and integrated circuitry. In one example, multiple user interface components or peripheral components, or both, couple to interface 2214. Network interface 2250 provides system 2200 the ability to communicate with remote devices (e.g., servers or other computing devices) over one or more networks. Network interface 2250 can include an Ethernet adapter, wireless interconnection components, cellular network interconnection components, USB (universal serial bus), or other wired or wireless standards-based or proprietary interfaces. Network interface 2250 can transmit data to a device that is in the same data center or rack or a remote device, which can include sending data stored in memory. Network interface 2250 can receive data from a remote device, which can include storing received data into memory. Various embodiments can be used in connection with network interface 2250, processor 2210, and memory subsystem 2220.

In one example, system 2200 includes one or more input/output (I/O) interface(s) 2260. I/O interface 2260 can include one or more interface components through which a user interacts with system 2200 (e.g., audio, alphanumeric, tactile/touch, or other interfacing). Peripheral interface 2270 can include any hardware interface not specifically mentioned above. Peripherals refer generally to devices that connect dependently to system 2200. A dependent connection is one where system 2200 provides the software platform or hardware platform or both on which operation executes, and with which a user interacts.

In one example, system 2200 includes storage subsystem 2280 to store data in a nonvolatile manner. In one example, in certain system implementations, at least certain components of storage 2280 can overlap with components of memory subsystem 2220. Storage subsystem 2280 includes storage device(s) 2284, which can be or include any conventional medium for storing large amounts of data in a nonvolatile manner, such as one or more magnetic, solid state, or optical based disks, or a combination. Storage 2284 holds code or instructions and data 2286 in a persistent state (i.e., the value is retained despite interruption of power to system 2200). Storage 2284 can be generically considered to be a "memory," although memory 2230 is typically the executing or operating memory to provide instructions to processor 2210. Whereas storage 2284 is nonvolatile, memory 2230 can include volatile memory (i.e., the value or state of the data is indeterminate if power is interrupted to system 2200). In one example, storage subsystem 2280 includes controller 2282 to interface with storage 2284. In one example controller 2282 is a physical part of interface 2214 or processor 2210 or can include circuits or logic in both processor 2210 and interface 2214.

A volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), Intel® Optane™ memory, NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 2200. More specifically, power source typically interfaces to one or multiple power supplies in system 2200 to provide power to the components of system 2200. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 2200 can be implemented using interconnected processors, memories, storages, network interfaces, and other components. High speed interconnects can be used such as: Ethernet (IEEE 802.3), remote direct memory access (RDMA), InfiniBand, Internet Wide Area RDMA Protocol (iWARP), quick UDP Internet Connections (QUIC), RDMA over Converged Ethernet (RoCE), Peripheral Component Interconnect express (PCIe), Intel Quick-Path Interconnect (QPI), Intel Ultra Path Interconnect (UPI), Intel On-Chip System Fabric (IOSF), Omnipath, Compute Express Link (CXL), HyperTransport, high-speed fabric, NVLink, Advanced Microcontroller Bus Architecture (AMBA) interconnect, OpenCAPI, Gen-Z, Cache Coherent Interconnect for Accelerators (CCIX), 3GPP Long Term Evolution (LTE) (4G), 3GPP 5G, and variations thereof. Data can be copied or stored to virtualized storage nodes using a protocol such as NVMe over Fabrics (NVMe-oF) or NVMe.

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, a blade includes components common to conventional servers, including a main printed circuit board (main board) providing internal wiring (i.e., buses) for coupling appropriate integrated circuits (ICs) and other components mounted to the board.

Various embodiments can be used in data centers to scale-out storage or memory transactions involving memory pools, storage pools, or accelerators and using NVMe-oF. Various embodiments can be used by cloud service providers that use distributed resources (e.g., compute, memory, storage, accelerators, storage). Distributed resources can be located among one or more of: a base station, fog data center, edge data center, or remote data center. Various embodiments can be used in a base station that supports communications using wired or wireless protocols (e.g., 3GPP Long Term Evolution (LTE) (4G) or 3GPP 5G), on-premises data centers, off-premises data centers, edge network elements, fog network elements, and/or hybrid data centers (e.g., data center that use virtualization, cloud and software-defined networking to deliver application workloads across physical data centers and distributed multi-cloud environments).

Figure 23:
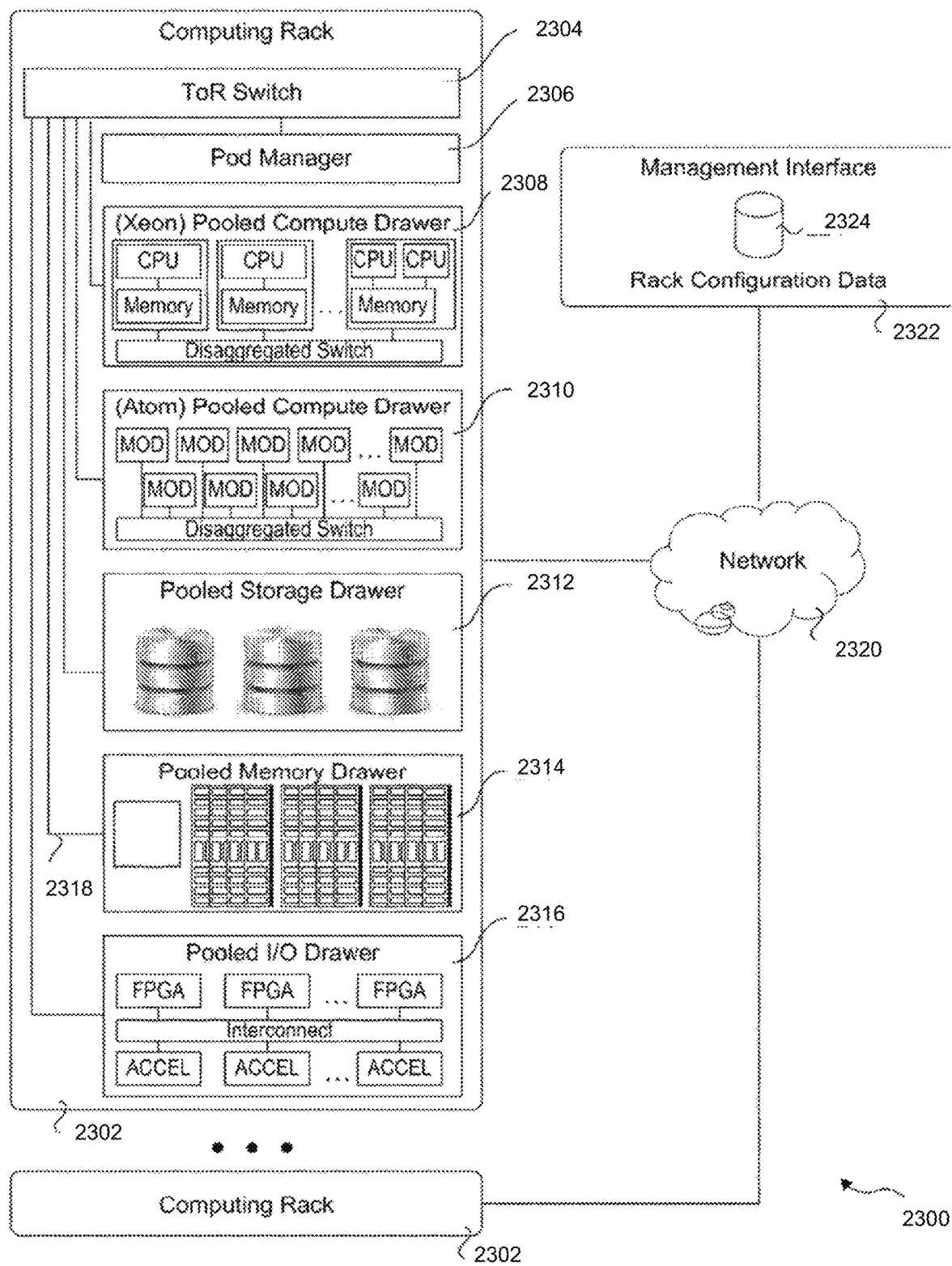
FIG. 23 depicts an environment.

FIG. 23 depicts an environment 2300 includes multiple computing racks 2302, each including a Top of Rack (ToR)

switch 2304, a pod manager 2306, and a plurality of pooled system drawers. Various embodiments can be used in a switch. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® XEON® pooled computer drawer 2308, and Intel® ATOM™ pooled compute drawer 2310, a pooled storage drawer 2312, a pooled memory drawer 2314, and a pooled I/O drawer 2316. Each of the pooled system drawers is connected to ToR switch 2304 via a high-speed link 2318, such as a 40 Gigabit/second (Gb/s) or 100 Gb/s Ethernet link or a 100+Gb/s Silicon Photonics (SiPh) optical link.

Multiple of the computing racks 2302 may be interconnected via their ToR switches 2304 (e.g., to a pod-level switch or data center switch), as illustrated by connections to a network 2320. In some embodiments, groups of computing racks 2302 are managed as separate pods via pod manager(s) 2306. In one embodiment, a single pod manager is used to manage all of the racks in the pod. Alternatively, distributed pod managers may be used for pod management operations.

Environment 2300 further includes a management interface 2322 that is used to manage various aspects of the environment. This includes managing rack configuration, with corresponding parameters stored as rack configuration data 2324. Environment 2300 can be used for computing racks.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry." A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Example 1 includes an apparatus comprising: a gain cell embedded dynamic random access memory (eDRAM) device comprising: a write circuit; a storage device; and a read circuit, wherein the read circuit is positioned at least partially underneath the write circuit and in a different plane than that of the write circuit and the storage device is to couple the write circuit to the read circuit and wherein one or more of the write circuit or the read circuit are bonded to the storage device.

Example 2 can be combined with any example, wherein the write circuit comprises: a layer with a drain region; a channel layer; a gate oxide layer; a gate layer with a write word line interface; and a source region with write bit line interface.

Example 3 can be combined with any example, wherein the read circuit comprises: a channel region; a gate oxide layer; a gate layer; a source region with read bit line interface; and a drain region with read word line interface.

Example 4 can be combined with any example, wherein the write circuit comprises: a layer; a drain region; a conductive region coupling the drain region to the storage device through the layer; a channel layer; a gate oxide layer; a gate layer; and a source region with write bit line interface.

Example 5 can be combined with any example, wherein the read circuit comprises: a gate region; a gate oxide region formed at least partially over the gate region; a channel region formed at least partially over the gate oxide region; a source region formed over a portion of the channel region; and a drain region formed over a portion of the channel region.

Example 6 can be combined with any example, wherein the write circuit comprises: a channel region; a gate oxide region formed at least partially over the channel region; a gate region formed at least partially over the gate oxide region; a source region formed over a portion of the channel region; and a drain region formed over a portion of the channel region.

Example 7 can be combined with any example, wherein the write circuit comprises: a channel region; a source region formed under a portion of the channel region; a drain region formed under a portion of the channel region; a gate oxide region formed at least partially over the channel region; and a gate region formed at least partially over the gate oxide region.

Example 8 can be combined with any example, wherein the storage device comprises: at least one capacitor and a dielectric in contact with the at least one capacitor.

Example 9 can be combined with any example, wherein the storage device comprises a Capacitor Over Bitline (COB).

Example 10 can be combined with any example, wherein the write circuit comprises one or more of: Poly-Si, Si, Ge, poly-Ge, GaN, MoS2, WSe2, MoSe2, WSe2, InS, HfS, ZnS, ZnSe, In2O3, ZnO, AZO, IGZO, or IZO.

Example 11 can be combined with any example, wherein the write circuit is bonded to the storage device using a bonding material.

Example 12 can be combined with any example, wherein the bonding material comprises one or more of: silicon dioxide (SiO2), silicon oxynitride (SiON), carbon doped-silicon oxynitride (SiOCN), silicon carbon nitride (SiCN), or silicon oxycarbide (SiOC).

Example 13 can be combined with any example, wherein the read circuit is bonded to the storage device using a bonding material.

Example 14 can be combined with any example, wherein the bonding material comprises one or more of: silicon dioxide (SiO2), silicon oxynitride (SiON), carbon doped-silicon oxynitride (SiOCN), silicon carbon nitride (SiCN), or silicon oxycarbide (SiOC).

Example 15 can be combined with any example, comprising compute near memory (CNM) circuitry, wherein the CNM circuitry is bonded to the read or write circuit.

Example 16 can be combined with any example, comprising memory emulation circuitry to provide an output from the gain cell eDRAM device at a different effective output rate.

Example 17 can be combined with any example, and includes: an apparatus comprising: a memory device comprising a gain cell embedded dynamic random access memory (eDRAM) memory cell, the gain cell eDRAM memory cell comprising a write circuit formed at least partially over a storage cell and a read circuit formed at least partially under the storage cell and a compute near memory device bonded to the memory device.

Example 18 can be combined with any example, wherein the compute near memory device is to perform one or more of: a dot-product engine to perform vector-vector multiplication, multiplication and accumulation (MAC), AND, OR, XOR, NOT, neural network activation operations, exponentiation for soft-max, data compression, encryption, media accelerators, string matching or regular expression accelerators, or pointer chasing.

Example 19 can be combined with any example, comprising emulation circuitry to provide an output of the memory device to emulate output of a second memory device.

Example 20 can be combined with any example, wherein the emulation circuitry comprises one or more of: a controller, a multiplexer, or a register.

Example 21 can be combined with any example, comprising a processor coupled to the memory device and the compute near memory device.

Example 22 can be combined with any example, wherein the compute near memory device is bonded to the memory device using a bonding material and wherein the bonding material comprises one or more of: silicon dioxide (SiO2), silicon oxynitride (SiON), carbon doped-silicon oxynitride (SiOCN), silicon carbon nitride (SiCN), or silicon oxycarbide (SiOC).

Example 23 can be combined with any example, and includes a method of forming a gain cell memory device comprising: forming over a first substrate, a first region comprising a word line driver, read circuitry and active fins; forming a dielectric region over the first region; forming at least one storage region in the dielectric region; forming a layer of non-silicon-based write circuits over the dielectric region; bonding a second substrate onto the layer of non-silicon-based write circuits; and removing the first substrate to expose the active fins.

Example 24 can be combined with any example, wherein bonding a second substrate onto the layer of non-silicon-based write circuits comprises applying a bonding material to opposing surfaces of the second substrate and the layer of non-silicon-based write circuits, wherein the bonding material comprises one or more of: silicon dioxide (SiO2), silicon oxynitride (SiON), carbon doped-silicon oxynitride (SiOCN), silicon carbon nitride (SiCN), or silicon oxycarbide (SiOC).

Example 25 can be combined with any example, wherein: bonding a second substrate onto the layer of non-silicon-based write circuits comprises: applying the bonding material using one or more of: silicon dioxide (SiO2), silicon oxynitride (SiON), carbon doped-silicon oxynitride (SiOCN), silicon carbon nitride (SiCN), or silicon oxycarbide (SiOC) and pressing bonding material of opposing surfaces against each other.

Example 26 can be combined with any example, wherein the forming a layer of write circuits over the dielectric region comprising bonding a layer of write circuits to a surface of the dielectric region.

Example 27 can be combined with any example, comprising forming circuitry in the second substrate.

Example 28 can be combined with any example, and comprising: a system comprising: a memory device comprising a gain cell embedded dynamic random access memory (eDRAM) memory cell, the eDRAM memory cell comprising a write circuit formed at least partially over a storage cell and a read circuit formed at least partially under the storage cell; a compute near memory device bonded to the memory device; a processor; and an interface from the memory device to the processor.

Example 29 can be combined with any example, wherein the compute near memory device is to perform one or more of: a dot-product engine performing vector-vector multiplication, multiplication and accumulation (MAC), AND, OR, XOR, NOT, neural network activation operations, exponentiation for soft-max, data compression, encryption, media accelerators, string matching or regular expression accelerators, or pointer chasing.

Example 30 can be combined with any example, comprising emulation circuitry to provide an output of the memory device to emulate output read rate of an SRAM memory device.

Example 31 can be combined with any example, wherein the emulation circuitry comprises one or more of: a controller, a multiplexer, or a register.

Example 32 can be combined with any example, wherein: the controller is to control transfer of memory access requests to multiple banks of the memory device and according to selection by the controller, the multiplexer is to send data from the memory device to the compute near memory device or the multiplexer is to receive data from the compute near memory device to provide to the memory device.

Example 33 can be combined with any example, wherein: the register is to buffer data output from the memory device prior to output to the compute near memory device.

Example 34 can be combined with any example, wherein the compute near memory device is bonded to the memory device using a bonding material comprising one or more of: silicon dioxide (SiO2), silicon oxynitride (SiON), carbon doped-silicon oxynitride (SiOCN), silicon carbon nitride (SiCN), or silicon oxycarbide (SiOC).

Example 35 can be combined with any example, comprising a network interface communicatively coupled to the processor.

Example 36 can be combined with any example and includes a system comprising: at least one processor; and at least one memory coupled to the at least one processor, the at least one memory comprising: a gain cell embedded dynamic random access memory (eDRAM) device comprising: a write circuit; a storage device; and a read circuit, wherein the read circuit is positioned at least partially underneath the write circuit and in a different plane than that of the write circuit and the storage device is to couple the write circuit to the read circuit and wherein one or more of the write circuit or the read circuit are bonded to the storage device.

Example 37 can be combined with any example, wherein the storage device comprises: at least one capacitor and a dielectric in contact with the at least one capacitor.

Example 38 can be combined with any example, wherein the write circuit comprises one or more of: Poly-Si, Si, Ge, poly-Ge, GaN, MoS2, WSe2, MoSe2, WSe2, InS, HfS, ZnS, ZnSe, In2O3, ZnO, AZO, IGZO, or IZO.

Example 39 can be combined with any example, wherein the read circuit is bonded to the storage device using a bonding material and wherein the bonding material comprises one or more of: silicon dioxide (SiO2), silicon oxynitride (SiON), carbon doped-silicon oxynitride (SiOCN), silicon carbon nitride (SiCN), or silicon oxycarbide (SiOC).

What is claimed is:

1. An apparatus comprising:
   a gain cell embedded dynamic random access memory (eDRAM) device comprising:
   a write circuit;
   a storage device; and
   a read circuit, wherein
      the write circuit is positioned at least partially over the storage device,
      the read circuit is positioned at least partially underneath the write circuit and at least partially underneath the storage device and in a different plane than that of the write circuit and the storage device is to couple the write circuit to the read circuit,
      the write circuit is bonded to the storage device using a bonding material, and
      the bonding material comprises one or more of: silicon dioxide (SiO2), silicon oxynitride (SiON), carbon doped-silicon oxynitride (SiOCN), silicon carbon nitride (SiCN), or silicon oxycarbide (SiOC).

2. The apparatus of claim 1, wherein the write circuit comprises:
   a layer with a drain region;
   a channel layer;
   a gate oxide layer;
   a gate layer with a write word line interface; and
   a source region with a write bit line interface.

3. The apparatus of claim 1, wherein the read circuit comprises:
   a channel region;
   a gate oxide layer;
   a gate layer;
   a source region with a read bit line interface; and
   a drain region with a read word line interface.

4. The apparatus of claim 1, wherein the write circuit comprises:
a layer;
a drain region;
a conductive region coupling the drain region to the storage device through the layer;
a channel layer;
a gate oxide layer;
a gate layer; and
a source region with a write bit line interface.

5. The apparatus of claim 1, wherein the read circuit comprises:
a gate region;
a gate oxide region formed over a portion of the gate region;
a channel region formed over a portion of the gate oxide region;
a source region formed over a portion of the channel region; and
a drain region formed over a portion of the channel region.

6. The apparatus of claim 1, wherein the write circuit comprises:
a channel region;
a gate oxide region formed over a portion of the channel region;
a gate region formed over a portion of the gate oxide region;
a source region formed over a portion of the channel region; and
a drain region formed over a portion of the channel region.

7. The apparatus of claim 1, wherein the write circuit comprises:
a channel region;
a source region formed under a portion of the channel region;
a drain region formed under a portion of the channel region;
a gate oxide region formed over a portion of the channel region; and
a gate region formed over a portion of the gate oxide region.

8. The apparatus of claim 1, wherein the storage device comprises:
at least one capacitor and a dielectric in contact with the at least one capacitor.

9. The apparatus of claim 1, wherein the storage device comprises a Capacitor Over Bitline (COB).

10. The apparatus of claim 1, wherein the write circuit comprises one or more of:
Poly-Si, Si, Ge, poly-Ge, III-V, GaN, MoS2, WSe2, MoSe2, WSe2, InS, HfS, ZnS, ZnSe, In2O3, ZnO, AZO, IGZO, or IZO.

11. The apparatus of claim 1, wherein the read circuit is bonded to the storage device using a bonding material.

12. The apparatus of claim 11, wherein the bonding material comprises one or more of: silicon dioxide (SiO2), silicon oxynitride (SiON), carbon doped-silicon oxynitride (SiOCN), silicon carbon nitride (SiCN), or silicon oxycarbide (SiOC).

13. The apparatus of claim 1, comprising compute near memory (CNM) circuitry, wherein the CNM circuitry is bonded to the read or write circuit.

14. The apparatus of claim 1, comprising memory emulation circuitry to provide an output from the gain cell eDRAM device at a configured output rate.

15. A system comprising:
at least one processor; and
at least one memory coupled to the at least one processor, the at least one memory comprising:
a gain cell embedded dynamic random access memory (eDRAM) device comprising:
a write circuit;
a storage device; and
a read circuit, wherein
the write circuit is positioned at least partially over the storage device,
the read circuit is positioned at least partially underneath the storage device,
the read circuit is positioned at least partially underneath the write circuit and in a different plane than that of the write circuit,
the storage device is to couple the write circuit to the read circuit, and
one or more of the write circuit or the read circuit are bonded to the storage device.

16. The system of claim 15, wherein the storage device comprises:
at least one capacitor and a dielectric in contact with the at least one capacitor.

17. The system of claim 15, wherein the write circuit comprises one or more of:
Poly-Si, Si, Ge, poly-Ge, III-V, GaN, MoS2, WSe2, MoSe2, WSe2, InS, HfS, ZnS, ZnSe, In2O3, ZnO, AZO, IGZO, or IZO.

18. The system of claim 15, wherein the read circuit is bonded to the storage device using a bonding material and wherein the bonding material comprises one or more of: silicon dioxide (SiO2), silicon oxynitride (SiON), carbon doped-silicon oxynitride (SiOCN), silicon carbon nitride (SiCN), or silicon oxycarbide (SiOC).

19. The system of claim 15, wherein the write circuit is bonded to the storage device using a bonding material and wherein the bonding material comprises one or more of: silicon dioxide (SiO2), silicon oxynitride (SiON), carbon doped-silicon oxynitride (SiOCN), silicon carbon nitride (SiCN), or silicon oxycarbide (SiOC).

* * * * *